*US006153660A*

United States Patent [19]
Fujimaki et al.

[11] Patent Number: 6,153,660
[45] Date of Patent: Nov. 28, 2000

[54] PHOTOPOLYMERIZABLE COMPOSITION

[75] Inventors: Kazuhiro Fujimaki; Yasuo Okamoto; Kazuo Fujita; Tadahiro Sorori, all of Shizuoka, Japan

[73] Assignee: Fuji Photo Film Co., Ltd., Minami-Ashigara, Japan

[21] Appl. No.: 09/210,590

[22] Filed: Dec. 15, 1998

[30] Foreign Application Priority Data

Dec. 15, 1997 [JP] Japan ..................................... 9-363195

[51] Int. Cl.[7] .......................... G03C 1/735; G03F 7/033; G03F 7/037; G03F 7/031; G03F 2/50
[52] U.S. Cl. .............................. 522/29; 522/66; 522/121; 522/120; 522/114; 522/26; 430/281.1; 430/286.1; 430/287.1
[58] Field of Search ............................. 430/286.1, 287.1, 430/281.1; 522/26, 29, 66, 121, 142, 114, 120

[56] References Cited

U.S. PATENT DOCUMENTS

| | | | |
|---|---|---|---|
| 4,687,727 | 8/1987 | Toyama et al. | 430/175 |
| 5,858,617 | 1/1999 | Nakayama et al. | 522/26 |
| 5,925,491 | 7/1999 | Baumann et al. | 430/175 |

FOREIGN PATENT DOCUMENTS

| | | |
|---|---|---|
| 0565488 | 10/1993 | European Pat. Off. . |
| 0723167 | 7/1996 | European Pat. Off. . |
| 0747771 | 12/1996 | European Pat. Off. . |
| 197 08 201 | 9/1997 | Germany . |
| WO95/09383 | 4/1995 | WIPO . |

*Primary Examiner*—Susan W. Berman
*Attorney, Agent, or Firm*—Burns, Doane, Swecker & Mathis, LLP

[57] ABSTRACT

A photopolymerizable composition is disclosed, comprising at least A) a compound having an addition-polymerizable ethylenically unsaturated bond, B) a metallocene compound photopolymerization initiator and C) a polymer binder having an amido group on the side chain thereof and being substantially soluble in an alkali water.

3 Claims, No Drawings

PHOTOPOLYMERIZABLE COMPOSITION

FIELD OF THE INVENTION

The present invention relates to a photopolymerizable composition for use in photosensitive lithographic printing plates or photoresists. More specifically, the present invention relates to a photopolymerizable composition having very high sensitivity to beams in the visible region, such as $Ar^+$ laser beam and FD-YAG laser beam, and at the same time exhibiting excellent capabilities with respect to the developability, inking property, tone value and press life when it is used in a lithographic printing plate or the like.

BACKGROUND OF THE INVENTION

Heretofore, a large number of image formation methods using a photopolymerization system have been known and used over a wide range of fields such as printing plate, printed circuit, hologram recording and three-dimensional formation.

For example, a printing plate is generally manufactured by a method such that a photopolymerizable composition comprising a compound having an addition-polymerizable ethylenic double bond, a photopolymerization initiator, an organic polymer compound and a thermal polymerization inhibitor is provided as a film layer on a support and exposed to a desired image to polymerization-cure the exposed area and the unexposed area is dissolution-removed to form a cured relief image.

Use of a copolymer of a (meth)acrylic acid and a (meth)acrylic acid ester as the organic polymer of the above-described composition is conventionally known in a large number of publications and described, for example, in JP-B-54-34327 (the term "JP-B" as used herein means an "examined Japanese paten publication"), JP-B-58-12577, JP-A-60-159743 (the term "JP-A" as used herein means an "unexamined published Japanese patent application") and JP-A-60-208748.

Furthermore, JP-B-3-63740 describes the fact that the curing efficiency increases by using a copolymer of an allyl (meth)acrylate and a (meth)acrylic acid as the organic polymer of a photopolymerizable composition.

However, these conventional compositions have not yet succeeded in achieving sufficiently high capabilities and improvement is demanded particularly in view of sensitivity, degree of curing, developability and press life.

On the other hand, studies on high-sensitivity photosensitive materials using a photopolymerizable photosensitive material are advancing and such photosensitive materials are intended to be applied to various fields. Of those, particularly a laser direct plate-making system is being used in practice and to cope with this, a high-sensitivity photopolymer system capable of responding to the oscillation wavelength of a laser, for example, 488 nm of argon ion laser and 532 nm of FD-YAG laser, is keenly demanded.

Titanocene compounds are an effective metallocene compound photopolymerization initiator as described in JP-A-59-152396, JP-A-61-151197, JP-A-63-10602, JP-A-63-41484 and JP-A-3-12403, and examples of the combination use system thereof include a system of titanocene and a 3-ketocoumarin dye (see, JP-A-63-221110), a system comprising a combination of titanocene, a xanthene dye and further an addition-polymerizable ethylenically unsaturated compound containing an amino group or a urethane group (see, JP-A-4-221958 and JP-A-4-219756), and a system of titanocene and a specific merocyanine dye (see, JP-A-6-295061).

However, conventionally used photopolymerizable compositions cannot satisfy all capabilities such as sensitivity, degree of curing, developability and press life, in good balance.

SUMMARY OF THE INVENTION

An object of the present invention is to provide a photopolymerizable composition having very high sensitivity to beams in the visible region, particularly to visible rays at 400 nm or more such as rays at 488 nm or 532 nm corresponding to the output of $Ar^+$ laser or YAG-SHG laser, respectively, and exhibiting excellent capabilities in the developability, inking property, tone value and press life particularly when it is used in a photosensitive litho-graphic printing plate or the like.

As a result of extensive investigations to attain the above-described object, the present inventors have found that by using an organic polymer compound having a specific functional group on the side chain and preferably having a specific weight average molecular weight as the binder of a photopolymerizable composition, capabilities in good balance such as sensitivity, development allowableness, inking property, tone value and press life can be achieved. The present invention has been accomplished based on this finding.

More specifically, the present invention provides the following photopolymerizable compositions (1) to (4):

(1) a photopolymerizable composition comprising at least A) a compound having an addition-polymerizable ethylenically unsaturated bond, B) a metallocene compound photopolymerization initiator and C) a polymer binder having an amido group on the side chain thereof and being substantially soluble in an alkali water;

(2) the photopolymerizable composition as described in (1) above, wherein B) the metallocene compound photopolymerization initiator is a titanocene compound;

(3) the photopolymerizable composition as described in (1) or (2) above, wherein C) the polymer binder having an amido group on the side chain thereof and being substantially soluble in an alkali water is an organic polymer compound having at least an amido group represented by the following formula (1), an alkenyl-containing group represented by the following formula (2) and a carboxyl group on the side chain thereof:

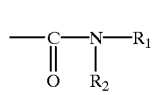

(1)

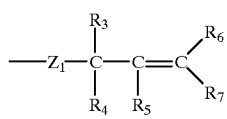

(2)

wherein in formula (1), $R_1$ and $R_2$ each independently represents a hydrogen atom, an alkyl group which may have substituent, an alkenyl group which may have substituent, an alkynyl group which may have substitutent, an aryl group which may have substituent, a heterocyclic group or a substituted sulfonyl group, and $R_1$ and $R_2$ may be combined to form a ring structure; and in formula (2), $R_3$ to $R_7$ each independently represents a hydrogen atom, a halogen atom, a carboxyl group, a sulfonato group, a nitro group, a cyano group, an amido group, an amino group, an alkyl group which may have substituent, an alkenyl group which may have substituent, an alkynyl group which may have substituent, an aryl group which may have substituent, a substituted oxy group or a substituted sulfonyl group, and $Z_1$ represents an oxygen atom, a sulfur atom or $NR_8$ (wherein $R_8$ represents a hydrogen atom or an alkyl group); and (4) the photopolymerizable composition as described in any one of (1) to (3) above, which further contains a compound represented by formula (3) as a visible ray sensitizing dye:

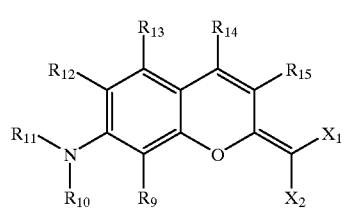

(3)

wherein $R_9$ to $R_{13}$ each independently represents a hydrogen atom, a halogen atom, an alkyl group, an aryl group, an alkenyl group, a hydroxyl group, a substituted oxy group, a mercapto group, an amino group, a substituted carbonyl group, a sulfo group, a sulfonato group, a substituted sulfinyl group, a substituted sulfonyl group, a phosphono group, a phosphonato group, a cyano group, a nitro group or a silyl group, $R_9$ and $R_{10}$ or $R_{11}$ and $R_{12}$ may form a ring comprising a nonmetallic atom together with the carbon atoms to which $R_9$ and $R_{10}$ or $R_{11}$ and $R_{12}$ are bonded, $R_{14}$ and $R_{15}$ each independently represents a hydrogen atom, a halogen atom, an alkyl group, an aryl group, an alkenyl group, a hydroxyl group, a substituted oxy group, a mercapto group, an amino group, a substituted carbonyl group, a sulfo group, a sulfonato group, a substituted sulfinyl group, a substituted sulfonyl group, a phosphono group, a phosphonato group, a cyano group, a nitro group, a silyl group or a heterocyclic group, $R_{13}$ and $R_{14}$ or $R_{14}$ and $R_{15}$ may form a ring comprising a nonmetallic atom together with the carbon atoms to which $R_{13}$ and $R_{14}$ or $R_{14}$ and $R_{15}$ are bonded, $X_1$ and $X_2$ each represents a cyano group or a substituted carbonyl group, and $X_1$ and $X_2$ may be combined to form a ring.

DETAILED DESCRIPTION OF THE INVENTION

The present invention is described in detail below.

The polymer binder for use in the present invention is a polymer binder having an amido group on the side chain and being substantially soluble in an alkali water.

The polymer binder preferably has a weight average molecular weight of from 10,000 to 1,000,000.

The polymer binder of the present invention can be prepared by an ordinary radical polymerization of a radical polymerizable compound having an amido group on the side chain or a radical polymerizable compound having an amido group on the side chain with another radical polymerizable compound as a copolymerization component. In general, suspension polymerization or solution polymerization is used.

The side chain amido group in the polymer binder of the present invention is considered to have an effect such that the amido group coordinates to Ti of a titanocene compound which is preferably used as a photopolymerization initiator, to thereby increase the polymerization activity of the initiator, and as a result, high sensitivity is attained. Such a phenomenon seems to occur in other metallocene compound photopolymerization initiators. Furthermore, due to a hydrogen bonding property of the amido group, coagulation between polymer binders is intensified and a highly strong film is formed. This is advantageous in that the image formed product after the irradiation of light has excellent strength and in particular, when the composition is used for a photosensitive lithographic printing plate, a printing plate having an excellent press life can be obtained. Moreover, since the amido group has a hydrophilic property, the photopolymerizable composition obtained can have excellent developability.

The polymer binder of the present invention is preferably a polymer having at least an amido group represented by formula (1), an alkenyl-containing group represented by formula (2) and a carboxyl group on the side chain thereof. The moiety of formula (1) has a role of giving the above-described effect, the moiety of formula (2) has a role of contributing to further improvement in the sensitivity, inking property and tone value, and the carboxyl group has a role of contributing to the improvement in developability.

The polymer having at least an amido group represented by formula (1), an alkenyl-containing group represented by formula (2) and a carboxyl group on the side chain thereof, which is a preferred polymer binder for use in the present invention, is more preferably a polymer produced by an ordinary radical polymerization of the following monomers i) to iii):

i) a radical polymerizable compound having a group of formula (1), ii) a radical polymerizable compound having a group of formula (2), and iii) a radical polymerizable compound having a carboxyl group.

The contents of the respective groups are, in terms of the charged amount of a radical polymerizable compound containing each group, preferably such that i) is from 5 to 80 mol %, more preferably from 10 to 80 mol %, ii) is from 10 to 90 mol %, more preferably from 20 to 80 mol %, and iii) is from 3 to 30 mol %, more preferably from 5 to 25 mol %.

The amido group represented by formula (1) and the alkenyl-containing group represented by formula (2) are described below.

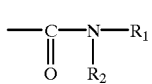

(1)

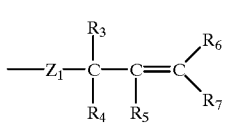

(2)

wherein in formula (1), $R_1$ and $R_2$ each independently represents a hydrogen atom, an alkyl group, an alkenyl group, an alkynyl group, an aryl group, a heterocyclic group or a substituted sulfonyl group, and $R_1$ and $R_2$ may be combined to form a ring structure; and in formula (2), $R_3$ to $R_7$ each independently represents a hydrogen atom, a halogen atom, a carboxyl group, a sulfonato group, a nitro group, a cyano group, an amido group, an amino group, an alkyl group, an alkenyl group, an alkynyl group, an aryl group, a substituted oxy group or a substituted sulfonyl group, and $Z_1$ represents an oxygen atom, a sulfur atom or $NR_8$ (wherein $R_8$ represents a hydrogen atom or an alkyl group).

Preferred embodiments of $R_1$ to $R_7$ are described in detail below.

The alkyl group represented by $R_1$, $R_2$, $R_3$, $R_4$, $R_5$, $R_6$ or $R_7$ includes a linear, branched or cyclic alkyl group having from 1 to 20 carbon atoms and specific examples thereof include a methyl group, an ethyl group, a propyl group, a butyl group, a pentyl group, a hexyl group, a heptyl group, an octyl group, a nonyl group, a decyl group, a undecyl group, a tridecyl group, a hexadecyl group, an octadecyl group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexy group, a cyclopentyl group and 2-norbornyl group. Of these, a linear alkyl group having from 1 to 12 carbon atoms, a branched alkyl group having from 3 to 12 carbon atoms and a cyclic alkyl group having from 5 to 10 carbon atoms are preferred.

The substituent of the substituted alkyl group represented by $R_1$, $R_2$, $R_3$, $R_4$, $R_5$, $R_6$ or $R_7$ is a group comprising a monovalent nonmetallic atom group exclusive of a hydrogen atom and preferred examples thereof include a hydrogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxy-carbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxy group, a carbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugated base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugated base group thereof (hereinafter referred to as a phosphonato group), a dialkylphosphono group (—$PO_3$(alkyl)$_2$; alkyl=alkyl group, hereinafter the same), a diarylphosphono group (—$PO_3$(aryl)$_2$; aryl=aryl group, hereinafter the same), an alkylarylphosphono group (—$PO_3$(alkyl)(aryl)), a monoalkylphosphono group (—$PO_3$(alkyl)) and a conjugated base group thereof (hereinafter referred to as an alkylphosphonato group), a monoarylphosphono group (—$PO_3H$(aryl)) and a conjugated base group thereof (hereinafter referred to as an arylphosphonato group), a phosphonooxy group (—$OPO_3H_2$) and a conjugated base group thereof (hereinafter referred to as a phosphonatooxy group), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and a conjugated base group thereof (hereinafter referred to as an alkylphosphonatooxy group), a monoarylphosphonooxy group (—$OPO_3H$(aryl)) and a conjugated base group thereof (hereinafter referred to as an arylphosphonatooxy group), a cyano group, a nitro group, an aryl group, an alkenyl group, an alkynyl group, a heterocyclic group and a silyl group.

Specific examples of the alkyl group in these substituents include the above-described alkyl groups and specific examples of the aryl group in those substituents include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a cyanophenyl group, a sulfophenyl group, a sulfonatophenyl group, a phosphonophenyl group and a phosphonatophenyl group.

Examples of the alkenyl group in those substituents include a vinyl group, a 1-propenyl group, a 1-butenyl group, a cinnamyl group and a 2-chloro-1-ethenyl group, and examples of the alkynyl group in those substituents include an ethynyl group, a 1-propynyl group, a 1-butynyl group and a trimethylsilylethynyl group.

$R_{01}$ in the acyl group ($R_{01}CO$—) includes a hydrogen atom and the above-described alkyl and aryl groups. Among these substituents, more preferred are a halogen atom (—F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group.

Examples of the heterocyclic group include a pyridyl group and a piperidinyl group.

Examples of the silyl group include a trimethylsilyl group.

The alkylene group in the substituted alkyl group includes a divalent organic residue resulting from eliminating any one of hydrogen atoms on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms. Specific preferred examples of the substituted alkyl group obtained by combining the substituent and the alkylene group include a chloromethyl group, a bromomethyl group, a 2-chloroethyl group, a trifluoromethyl group, a methoxymethyl group, an isopropoxymethyl group, a butoxymethyl group, a s-butoxybutyl group, a methoxyethoxyethyl group, an allyloxymethyl group, a phenoxyethyl group, a methylthiomethyl group, a tolylthiomethyl group, a pyridylmethyl group, a tetramethylpiperidinylmethyl group, an N-acetyl-tetramethylpiperidinylmethyl group, a trimethylsilylmethyl group, a methoxyethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

The aryl group represented by $R_1$, $R_2$, $R_3$, $R_4$, $R_5$, $R_6$ or $R_7$ includes a condensed ring formed by from 1 to 3 benzene rings and a condensed ring formed by a benzene ring and a 5-membered unsaturated ring, and specific examples thereof include a phenyl group, a naphthyl group, an anthryl group, a phenanthryl group, an indenyl group, an acenaphthenyl group and a fluorenyl group, with a phenyl group and a naphthyl group being preferred.

The substituted aryl group represented by $R_1$, $R_2$, $R_3$, $R_4$, $R_5$, $R_6$ or $R_7$ includes those having a group comprising a monovalent nonmetallic atom group exclusive of a hydrogen atom as a substituent on the ring-forming carbon atoms of the above-described aryl group. Preferred examples of the substituent include the above-described alkyl groups, substituted alkyl groups and substituents for the substituted alkyl group. Preferred specific examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolyl phosphonatophenyl group, an allylphenyl group, a 1-propenylmethylphenyl group, 2-butenylphenyl group, a 2-methylallylphenyl group, a 2-methylpropenylphenyl group, a 2-propenylphenyl group, a 2-butynylphenyl group and a 3-butynylphenyl group.

The alkenyl group, the substituted alkenyl group, the alkynyl group and the substituted alkynyl group (—C($R_{02}$)=C($R_{03}$)($R_{04}$) and —C≡C($R_{05}$)) represented by $R_1$, $R_2$, $R_3$, $R_4$, $R_5$, $R_6$ or $R_7$ may be those where $R_{02}$, $R_{03}$, $R_{04}$ or $R_{05}$ is a group comprising a monovalent nonmetallic atom group. Preferred examples of $R_{02}$, $R_{03}$, $R_{04}$ and $R_{05}$ include a hydrogen atom, a halogen atom, an alkyl group, a substituted alkyl group, an aryl group and a substituted aryl group. Specific examples thereof include those described above and more preferred examples of $R_{02}$, $R_{03}$, $R_{04}$ and $R_{05}$ include a hydrogen atom, a halogen atom and a linear, branched or cyclic alkyl group having from 1 to 10 carbon atoms. Specific preferred examples of the alkenyl group, the substituted alkenyl group, the alkynyl group and the substituted alkynyl group represented by $R_1$, $R_2$, $R_3$, $R_4$, $R_5$, $R_6$ or $R_7$ include a vinyl group, a 1-propenyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a 1-propynyl group, a 1-butynyl group and a phenylethynyl group.

The substituted oxy group ($R_{06}$CO—) represented by $R_3$, $R_4$, $R_5$, $R_6$ or $R_7$ includes those where $R_{06}$ is a group comprising a monovalent nonmetallic atom group exclusive of a hydrogen atom. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonooxy group and a phosphonatooxy group. The alkyl group and the aryl group in these groups include those described above for the alkyl group and the substituted alkyl group and those for the aryl group and the substituted aryl group, respectively. The acyl group ($R_{07}$CO—) in the acyloxy group include those where $R_{07}$ is the alkyl group, substituted alkyl group, aryl group or substituted aryl group described above for $R_1$ to $R_7$. Among these substituents, more preferred are an alkoxy group, an aryloxy group, an acyloxy group and an arylsulfoxy group. Specific examples of preferred substituted oxy groups include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonooxy group and a phosphonatooxy group.

The substituted amino group ($R_{08}NH$—, $(R_{09})(R_{010})N$—) represented by $R_3$, $R_4$, $R_5$, $R_6$ or $R_7$ includes those where $R_{08}$, $R_{09}$ and $R_{010}$ each is a group comprising a monovalent nonmetallic atom group exclusive of a hydrogen atom. $R_{09}$ and $R_{010}$ may be combined to form a ring. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N'-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group. The alkyl group and the aryl group in these groups include those described above for the alkyl group and the substituted alkyl group and those for the aryl group and the substituted aryl group, respectively, and $R_{07}$ of the acyl group ($R_{07}CO$—) in the acylamino group, the N-alkylacylamino group and the N-arylacylamino group are the same as described above. Among these, more preferred are an N-alkylamino group, an N,N-dialkylamino group, an N-arylamino group and an acylamino group. Specific examples of preferred substituted amino groups include a methylamino group, an ethylamino group, a diethylamino group, a morpholino group, a piperidino group, a pyrrolidino group, a phenylamino group, a benzoylamino group and an acetylamino group.

The substituted sulfonyl group ($R_{011}$—$SO_2$—) represented by $R_1$, $R_2$, $R_3$, $R_4$, $R_5$, $R_6$ or $R_7$ include those where $R_{011}$ is a group comprising a monovalent nonmetallic atom group. More preferred examples thereof include an alkylsulfonyl group and an arylsulfonyl group. The alkyl group and the aryl group in these groups include those described above for the alkyl group and the substituted alkyl group and those for the aryl group and the substituted aryl group, respectively. Specific examples of the substituted sulfonyl group include a butylsulfonyl group, a phenylsulfonyl group and a chlorophenylsulfonyl group.

The heterocyclic group represented by $R_1$ or $R_2$ include a pyridyl group described above as a substituent of the substituted alkyl group.

The sulfonato group (—$SO_3$—) represented by $R_3$, $R_4$, $R_5$, $R_6$ or $R_7$ is a conjugated base anion group of a sulfo group (—$SO_3H$) as described above and typically, the sulfonato group is preferably used together with a counter cation. Examples of the counter cation include generally known ones such as various oniums (e.g., ammoniums, sulfoniums, phosphoniums, iodoniums, aziniums) and metal ions (e.g., $Na^+$, $K^+$, $Ca^{2+}$, $Zn^{2+}$).

Examples of the ring formed by combining $R_1$ and $R_2$ in formula (1) to each other include morpholine, piperazine, pyrrolidine, pyrrole and indoline. These rings each may further be substituted by a substituent described above. The ring formed is preferably an alicyclic ring.

In formula (1), $R_1$ and $R_2$ each is preferably an alkyl group, an alkenyl group, an aryl group or a substituted sulfonyl group, or $R_1$ and $R_2$ preferably form together an alicylcic ring.

In formula (2), $R_3$ to $R_7$ each is preferably a hydrogen atom and $Z_1$ is preferably an oxygen atom.

More preferred specific examples of i) include the following compounds, however, the present invention is by no means limited thereto.

(M-1)

(M-2)

(M-3)

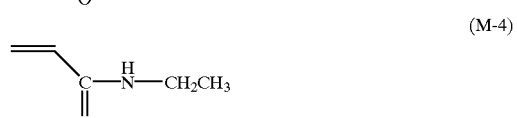

(M-4)

(M-5)

(M-6)

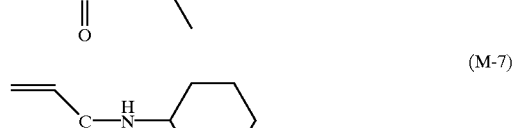

(M-7)

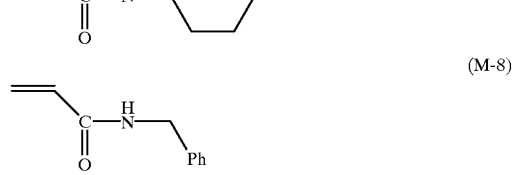

(M-8)

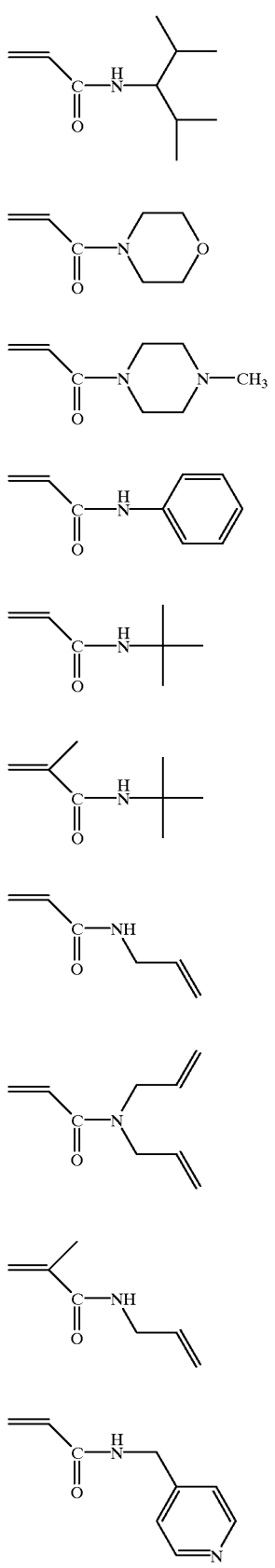
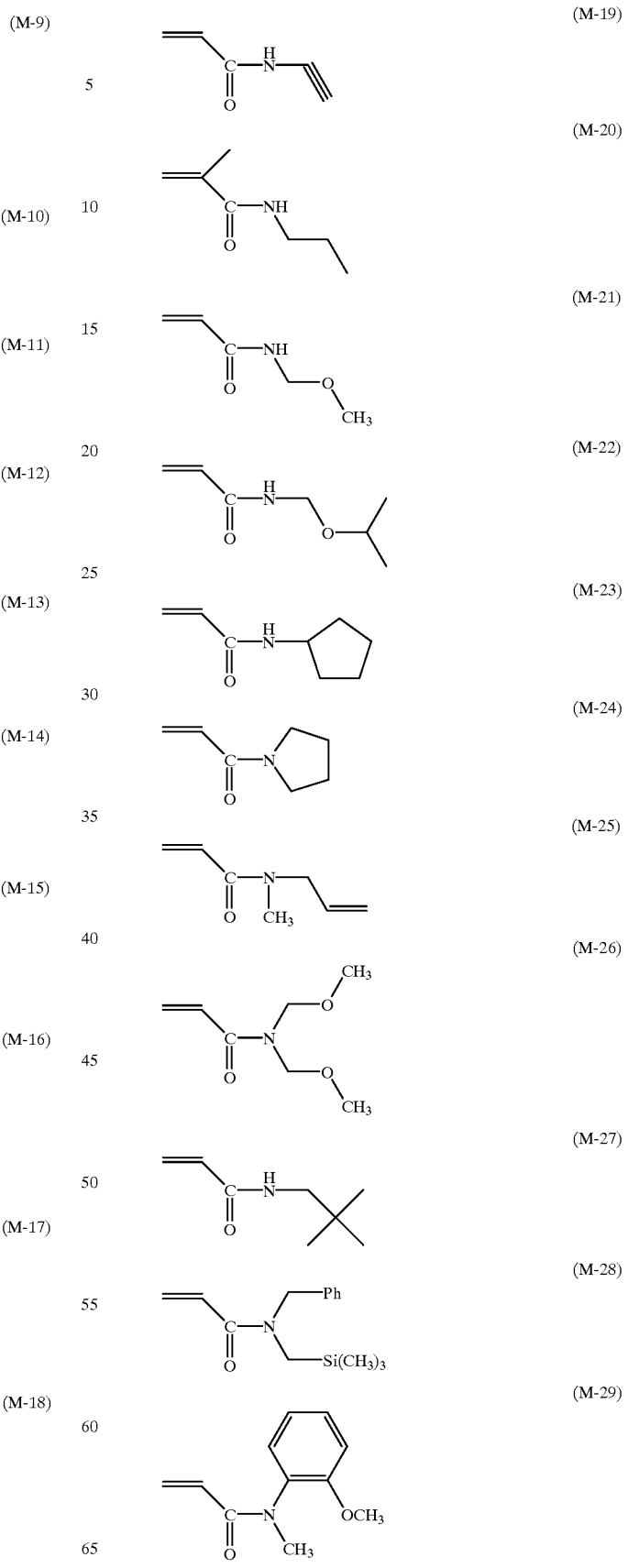

-continued

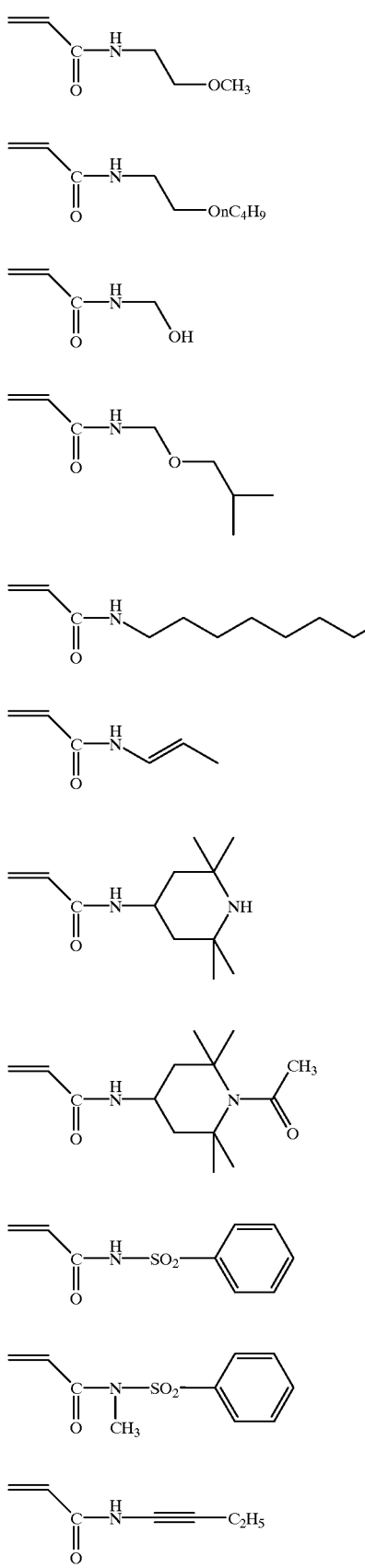

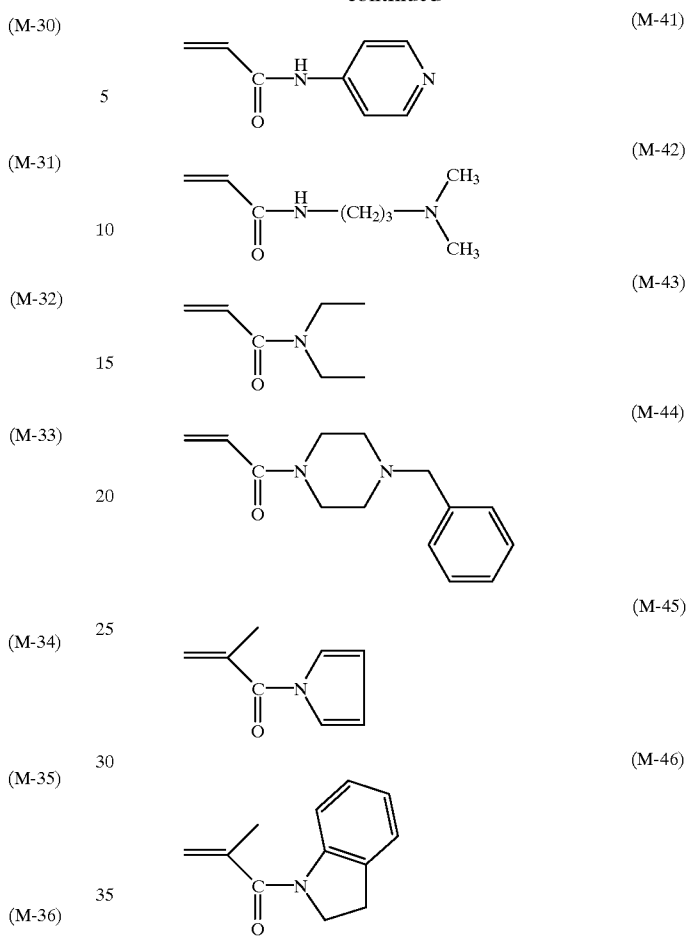

More preferred examples of ii) include allyl acrylate and allyl methacrylate, and more preferred examples of iii) include an acrylic acid and a methacrylic acid.

Specific examples of such copolymers are described later in the Synthesis Examples.

The use amount of the polymer binder (copolymer) for use in the present invention is from 10 to 90 wt %, preferably from 20 to 80 wt %, more preferably from 30 to 70 wt %.

A compound having an addition-polymerizable ethylenically unsaturated bond as component A) for use in the present invention is described below.

In the present invention, the compound having at least one addition-polymerizable ethylenically unsaturated bond as component A) is selected from the compounds having at least one, preferably two or more ethylenically unsaturated terminal bonds, for example, a compound having a chemical form of monomer, prepolymer, more specifically, dimer, trimer or oligomer, a mixture thereof or a copolymer thereof. Examples of the monomer and its copolymer include esters of an unsaturated carboxylic acid (e.g., acrylic acid, methacrylic acid, itaconic acid, crotonic acid, isocrotonic acid, maleic acid) with an aliphatic polyhydric alcohol compound, and amides of an unsaturated carboxylic acid with an aliphatic polyhydric amine compound.

Specific examples of the ester monomer of an aliphatic polyhydric alcohol compound with an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer;

methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane;

itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;

crotonic acid esters such as ethylene glycol dicrotonate, tetramethylene glycol dicrotonate, pentaerythritol dicrotonate and sorbitol tetradicrotonate;

isocrotonic acid esters such as ethylene glycol diisocrotonate, pentaerythritol diisocrotonate and sorbitol tetraisocrotonate;

maleic acid esters such as ethylene glycol dimaleate, triethylene glycol dimaleate, pentaerythritol dimaleate and sorbitol tetramaleate; and a mixture of the above-described ester monomers.

Specific examples of the amide monomer of an aliphatic polyhydric amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other examples include vinyl urethane compounds having two or more polymerizable vinyl groups in one molecule described in JP-B-48-41708, which are obtained by adding a vinyl monomer having a hydroxyl group represented by the following formula (A) to a polyisocyanate compound having two or more isocyanate groups in one molecule:

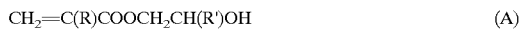

(wherein R and R' each represents H or CH$_3$).

Also, polyfunctional acrylates and methacrylates such as urethane acrylates described in JP-A-51-37193, polyester acrylates described in JP-A-48-64183, JP-B-49-43191 and JP-B-52-30490 and epoxy acrylates obtained by reacting an epoxy resin with a (meth)acrylic acid may be used. Furthermore, those described as a photocurable monomer or oligomer in *Nippon Secchaku Kyokaishi (Journal of Japan Adhesive Society)*, Vol. 20, No. 7, pp. 300–308 (1984) may be used.

Such a compound is used in an amount of from 5 to 50% by weight (hereinafter simply referred to as "%") preferably from 10 to 40%, based on the entire components.

A metallocene compound photopolymerization initiator as component B) for use in the present invention is described below.

The metallocene compound photopolymerization initiator may be any metallocene compound as far as it has an ability of initiating polymerization of the compound having an addition-polymerizable ethylenically unsaturated bond as component A). In particular, metallocene compounds having sensitivity to beams in the visible region are suitably used. Furthermore, an activating agent which causes any action with a photoexcited sensitizing dye to produce active radicals may be used as the metallocene compound photopolymerization initiator.

Examples of the metallocene compound which is preferably used in the present invention include titanocene compounds described in JP-A-59-152396, JP-A-61-151197, JP-A-63-41484, JP-A-2-249 and JP-A-2-4705, and iron-allene complexes described in JP-A-1-304453 and JP-A-1-152109.

Specific examples of the titanocene compound include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)bis(2,6-difluoro-3-(pyr-1-yl)phenyl)titanium (S-2 used later in the Examples), bis(cyclopentadienyl)bis[2,6-difluoro-3-(methylsulfonamido)phenyl]titanium, bis(cyclopentadienyl)bis[2,6-difluoro-3-(N-butylbialloylamino)phenyl]titanium, bis(cyclopentadienyl)bis[2,6-difluoro-3-(N-ethylacetylamino)phenyl]titanium, bis(cyclopentadienyl)bis[2,6-difluoro-3-(N-methylacetylamino)phenyl]titanium, bis(cyclopentadienyl)bis[2,6-difluoro-3-(N-ethylpropionylamino)phenyl]titanium, bis(cyclopentadienyl)bis[2,6-difluoro-3-(N-ethyl-(2,2-dimethylbutanoyl)amino)phenyl]titanium, bis(cyclopentadienyl)bis[2,6-difluoro-3-(N-butyl-(2,2-dimethylbutanoyl)amino)phenyl]titanium, bis(cyclopentadienyl)bis[2,6-difluoro-3-(N-pentyl-(2,2-dimethylbutanoyl)amino)phenyl]titanium, bis(cyclopentadienyl)bis[2,6-difluoro-3-(N-hexyl)-(2,2-dimethylbutanoyl)phenyl]titanium, bis(cyclopentadienyl)bis[2,6-difluoro-3-(N-methylbutyrylamino)phenyl]titanium, bis(cyclopentadienyl)bis[2,6-difluoro-3-(N-methylpentanoylamino)phenyl]titanium, bis(cyclopentadienyl)bis[2,6-difluoro-3-(N-ethylcyclohexylcarbonylamino)phenyl]titanium, bis(cyclopentadienyl)bis[2,6-difluoro-3-(N-ethylisobutyrylamino)phenyl]titanium, bis(cyclopentadienyl)bis[2,6-difluoro-3-(N-ethylacetylamino)phenyl]titanium, bis(cyclopentadienyl)bis[2,6-difluoro-3-(2,2,5,5-tetramethyl-1,2,5-azadisilolydin-1-yl)phenyl]titanium, bis(cyclopentadienyl)bis[2,6-difluoro-3-(octylsulfonamido)phenyl]titanium, bis(cyclopentadienyl)bis[2,6-difluoro-3-(4-tolylsulfonamido)phenyl]titanium, bis(cyclopentadienyl)bis[2,6-difluoro-3-(4-dodecylphenylsulfonylamido)phenyl]titanium, bis(cyclopentadienyl)bis[2,6-difluoro-3-(4-(1-pentylheptyl)phenylsulfonylamido)phenyl]titanium, bis(cyclopentadienyl)bis[2,6-difluoro-3-(ethylsulfonylamido)phenyl]titanium, bis(cyclopentadienyl)bis[2,6-difluoro-3-((4-bromophenyl)sulfonylamido)phenyl]titanium, bis (cyclopentadienyl)bis[2,6-difluoro-3-(2-naphthylsulfonylamido)phenyl]titanium, bis(cyclopentadienyl)bis[2,6-difluoro-3-(hexadecylsulfonylamido)phenyl]titanium, bis(cyclopentadienyl)bis[2,6-difluoro-3-(N-methyl-4-dodecylphenyl)sulfonylamido)phenyl]titanium, bis(cyclopentadienyl)bis[2,6-difluoro-3-(N-methyl-4-(1-pentylheptyl)phenyl)sulfonylamido)phenyl]titanium, bis(cyclopentadienyl)bis[2,6-difluoro-3-(N-hexyl(4-tolyl)sulfonylamido)phenyl]titanium, bis(cyclopentadienyl)bis[2,6-difluoro-3-(pyrrolidine-2,5-dion-1-yl)phenyl]titanium, bis(cyclopentadienyl)bis[2,6-difluoro-3-(N-3,4-dimethyl-3-pyrrolidine-2,5-dion-1-yl)phenyl]titanium, bis(cyclopentadienyl)bis[2,6-difluoro-3-(phthalimido)phenyl]titanium, bis(cyclopentadienyl)bis[2,6-difluoro-3-isobutoxycarbonylamino)phenyl]titanium, bis(cyclopentadienyl)bis[2,6-difluoro-3-(ethoxycarbonylamino)phenyl]titanium, bis(cyclopentadienyl)bis[2,6-difluoro-3-((2-chloroethoxy)carbonylamino)phenyl]titanium, bis(cyclopentadienyl)bis[2,6-difluoro-3-(phenoxycarbonylamino)phenyl]titanium, bis(cyclopentadienyl)bis[2,6-difluoro-3-(3-phenylthioureido)phenyl]titanium, bis(cyclopentadienyl)bis[2,6-difluoro-3-(3-butylthioureido)phenyl]titanium, bis(cyclopentadienyl)bis[2,6-difluoro-3-(3-phenylureido)phenyl]titanium, bis(cyclopentadienyl)bis[2,6-difluoro-3-(3-butylureido)phenyl]titanium, bis(cyclopentadienyl)bis[2,6-difluoro-3-(N,N-diacetylamino)phenyl]titanium, bis(cyclopentadienyl)bis[2,6-difluoro-3-(3,3-dimethylureido)phenyl]titanium, bis(cyclopentadienyl)bis[2,6-difluoro-3-(acetylamino)phenyl]titanium, bis(cyclopentadienyl)bis[2,6-difluoro-3-(butylamino)phenyl]titanium, bis(cyclopentadienyl)bis[2,6-difluoro-3-(decanoylamino)phenyl]titanium, bis(cyclopentadienyl)bis[2,6-difluoro-3-(octadecanoylamino)phenyl]titanium, bis(cyclopentadienyl)bis[2,6-difluoro-3-(isobutylamino)phenyl]titanium, bis(cyclopentadienyl)bis[2,6-difluoro-3-(2-ethylhexanoylamino)phenyl]titanium, bis(cyclopentadienyl)bis[2,6-difluoro-3-(2-methylbutanoylamino)phenyl]titanium, bis(cyclopentadienyl)bis[2,6-difluoro-3-(pivaloylamino)phenyl]titanium, bis(cyclopentadienyl)bis[2,6-difluoro-3-(2,2-dimethylbutanoylamino)phenyl]titanium, bis(cyclopentadienyl)bis[2,6-difluoro-3-(2-ethyl-2-methylheptanoylamino)phenyl]titanium, bis(cyclopentadienyl)bis[2,6-difluoro-3-(cyclohexylcarbonylamino)phenyl]titanium, bis(cyclopentadienyl)bis[2,6-difluoro-3-(2,2-dimethyl-3-chloropropanoylamino)phenyl]titanium, bis(cyclopentadienyl)bis[2,6-difluoro-3-(3-phenylpropanoylamino)phenyl]titanium, bis(cyclopentadienyl)bis[2,6-difluoro-3-(2-chloromethyl-2-methyl-3-chloropropanoylamino)phenyl]titanium, bis(cyclopentadienyl)bis[2,6-difluoro-3-(3,4-xyloylamino)phenyl]titanium, bis(cyclopentadienyl)bis[2,6-difluoro-3-(4-ethylbenzoylamino)phenyl]titanium, bis(cyclopentadienyl)bis[2,6-difluoro-3-(2,4,6-mesylcarbonylamino)phenyl]titanium, bis(cyclopentadienyl)bis[2,6-difluoro-3-(benzoylamino)phenyl]titanium, bis(cyclopentadienyl)bis[2,6-difluoro-3-(N-(3-phenylpropyl)benzoylamino)phenyl]titanium, bis(cyclopentadienyl)bis[2,6-difluoro-3-(N-(3-ethylheptyl)-2,2-dimethylpentanoylamino)phenyl]titanium, bis(cyclopentadienyl)bis[2,6-difluoro-3-(N-isobutyl-(4-tolyl)amino)phenyl]titanium, bis(cyclopentadienyl)bis[2,6-difluoro-3-(N-isobutylbenzoylamino)phenyl]titanium, bis(cyclopentadienyl)bis[2,6-difluoro-3-(N-cyclohexylmethylpivaloylamino)phenyl]titanium, bis(cyclopentadienyl)bis[2,6-difluoro-3-(N-(oxolan-2-ylmethyl)benzoylamino)phenyl]titanium, bis(cyclopentadienyl)bis[2,6-difluoro-3-(N-(3-ethylheptyl)-2,2-dimethylbutanoylamino)phenyl]titanium, bis(cyclopentadienyl)bis[2,6-difluoro-3-(N-(3-phenylpropyl)-(4-toluyl)amino)phenyl]titanium, bis(cyclopentadienyl)bis[2,6-difluoro-3-(N-(oxoran-2-ylmethyl)-(4-toluyl)amino)phenyl]titanium, bis(cyclopentadienyl)bis[2,6-difluoro-3-(N-(4-toluylmethyl)benzoylamino)phenyl]titanium, bis(cyclopentadienyl)bis[2,6-difluoro-3-(N-(4-toluylmethyl)-(4-toluyl)amino)phenyl]titanium, bis(cyclopentadienyl)bis[2,6-difluoro-3-(N-(butylbenzoylamino)phenyl]titanium, bis(cyclopentadienyl)bis[2,6-difluoro-3-(N-(butyl-(4-toluyl)amino)phenyl]titanium, bis(cyclopentadienyl)bis[2,6-difluoro-3-(N-(hexyl-(4-toluyl)amino)phenyl]titanium, bis(cyclopentadienyl)bis[2,6-difluoro-3-(N-(2,4-dimethylpentyl)-2,2-dimethylbutanoylamino)phenyl]titanium, bis(cyclopentadienyl)bis[2,6-difluoro-3-(2,4-dimethylpentyl)-2,2-dimethylpentanoylamino)phenyl]titanium, bis(cyclopentadienyl)bis[2,6-difluoro-3-((4-toluyl)amino)phenyl]titanium, bis(cyclopentadienyl)bis[2,6-difluoro-3-(2,2-dimethylpentanoylamino)phenyl]titanium, bis(cyclopentadienyl)bis[2,6-difluoro-3-(2,2-dimethyl-3-ethoxypropanoylamino)phenyl]titanium, bis(cyclopentadienyl)bis[2,6-difluoro-3-(2,2-dimethyl-3-allyloxypropanoylamino)phenyl]titanium, bis(cyclopentadienyl)bis[2,6-difluoro-3-(N-allylacetylamino)phenyl]titanium, bis(cyclopentadienyl)bis[2,6-difluoro-3-(2-ethylbutanoylamino)phenyl]titanium, bis(cyclopentadienyl)bis[2,6-difluoro-3-(N-cyclohexylmethylbenzoylamino)phenyl]titanium, bis(cyclopentadienyl)bis[2,6-difluoro-3-(N-cyclohexylmethyl-(4-toluyl)amino)phenyl]titanium, bis(cyclopentadienyl)bis[2,6-difluoro-3-(N-2-ethylhexyl)benzoylamino)phenyl]titanium, bis(cyclopentadienyl)bis[2,6-difluoro-3-(N-isopropylbenzoylamino)phenyl]titanium, bis(cyclopentadienyl)bis[2,6-difluoro-3-(N-(3-phenylpropyl)-2,2-dimethylpentanoylamino)phenyl]titanium, bis(cyclopentadienyl)bis[2,6-difluoro-3-(N-hexylbenzoylamino)phenyl]titanium, bis(cyclopentadienyl)bis[2,6-difluoro-3-(N-cyclohexylmethyl-2,2-dimethylpentanoylamino)phenyl]titanium, bis(cyclopentadienyl)bis[2,6-difluoro-3-(N-butylbenzoylamino)phenyl]titanium, bis(cyclopentadienyl)bis[2,6-difluoro-3-(N-(2-ethylhexyl)-2,2-dimethylpentanoylamino)phenyl]titanium, bis(cyclopentadienyl)bis[2,6-difluoro-3-(N-hexyl-2,2-dimethylpentanoylamino)phenyl]titanium, bis(cyclopentadienyl)bis[2,6-difluoro-3-(N-isopropyl-2,2-dimethylpentanoylamino)phenyl]titanium, bis(cyclopentadienyl)bis[2,6-difluoro-3-(N-(3-phenylpropyl)pivaloylamino)phenyl]titanium, bis(cyclopentadienyl)bis[2,6-difluoro-3-(N-butyl-2,2-dimethylpentanoylamino)phenyl]titanium, bis(cyclopentadienyl)bis[2,6-difluoro-3-(N-(2-methoxyethyl)benzoylamino)phenyl]titanium, bis(cyclopentadienyl)bis[2,6-difluoro-3-(N-benzylbenzoylamino)phenyl]titanium, bis(cyclopentadienyl)bis[2,6-difluoro-3-(N-benzyl-(4-toluyl)amino)phenyl]titanium, bis(cyclopentadienyl)bis[2,6-difluoro-3-(N-(2-methoxyethyl)-(4-toluyl)amino)phenyl]titanium, bis(cyclopentadienyl)bis[2,6-difluoro-3-(N-(4-methylphenylmethyl)-2,2-dimethylpentanoylamino)phenyl]titanium, bis(cyclopentadienylbis[2,6-difluoro-3-(N-(2-methoxyethyl)-2,2-dimethyl-pentanoylamino)phenyl]titanium, bis(cyclopentadienyl)bis[2,6-difluoro-3-(N-cyclohexylmethyl-(2-ethyl-2-methylheptanoyl)amino)phenyl]titanium, bis(cyclopentadienyl)bis[2,6-difluoro-3-(N-butyl-(4-chlorobenzoyl)amino)phenyl]titanium, bis (cyclopentadienyl)bis[2,6-difluoro-3-(N-hexyl-(2-ethyl-2-methylbutanoylamino)phenyl]titanium, bis(cyclopentadienyl)bis[2,6-difluoro-3-(N-cyclohexyl-2,2-dimethylpentanoylamino)phenyl]titanium, bis(cyclopentadienyl)bis[2,6-difluoro-3-(N-(oxoran-2-ylmethyl)-2,2-dimethylpentanoylamino)phenyl]titanium, bis(cyclopentadienyl)bis[2,6-difluoro-3-(N-cyclohexyl-(4-chlorobenzoyl)amino)phenyl]titanium, bis(cyclopentadienyl)bis[2,6-difluoro-3-(N-cyclohexyl-(2-chlorobenzoylamino)phenyl]titanium, bis(cyclopentadienyl)bis[2,6-difluoro-3-(3,3-dimethyl-2,2-azetidinon-1-yl)phenyl]titanium, bis(cyclopentadienyl)bis[2,6-difluoro-3-isocyanatophenyl)titanium, bis(cyclopentadienyl)bis[2,6-difluoro-3-(N-ethyl-(4-tolylsulfonyl)amino)phenyl]titanium, bis(cyclopentadienyl)bis[2,6-difluoro-3-(N-hexyl-(4-tolylsulfonyl)amino)phenyl]titanium, bis(cyclopentadienyl)bis[2,6-difluoro-3-(N-butyl-(4-tolylsulfonyl)amino)phenyl]titanium, bis(cyclopentadienyl)bis[2,6-difluoro-3-(N-isobutyl-(4-tolylsulfonyl)amino)phenyl]titanium, bis(cyclopentadienyl)bis[2,6-difluoro-3-(N-butyl-(2,2-dimethyl-3-chloropropanoyl)amino)phenyl]titanium, bis(cyclopentadienyl)bis[2,6-difluoro-3-(N-(3-phenylpropyl)-2,2-dimethyl-3-chloropropanoyl)amino)phenyl]-titanium, bis(cyclopentadienyl)bis[2,6-difluoro-3-(N-cyclohexylmethyl-(2,2-dimethyl-3-chloropropanoyl)amino)phenyl]titanium, bis(cyclopentadienyl)bis[2,6-difluoro-3-(N-isobutyl-(2,2-dimethyl-3-chloropropanoyl)phenyl]titanium, bis(cyclopentadienyl)bis[2,6-difluoro-3-(N-butyl-(2-chloromethyl-2-methyl-3-chloropropanoyl)amino)phenyl]titanium, bis(cyclopentadienyl)bis[2,6-difluoro-3-(butylthiocarbonylamino)phenyl]titanium, bis(cyclopentadienyl)bis[2,6-difluoro-3-(phenylthiocarbonylamino)phenyl]titanium, bis(methylcyclopentadienyl)bis[2,6-difluoro-3-(N-hexyl-2,2-dimethylbutanoylamino)phenyl]titanium, bis(methylcyclopentadienyl)bis[2,6-difluoro-3-(N-hexyl-2,2-dimethylpentanoylamino)phenyl]titanium, bis(methylcyclopentadienyl)bis[2,6-difluoro-3-(N-ethylacetylamino)phenyl]titanium, bis(methylcyclopentadienyl)bis[2,6-difluoro-3-(N-ethylpropionylamino)phenyl]titanium, bis(trimethylsilylpentadienyl)bis[2,6-difluoro-3-(N-butyl-2,2-dimethylpropanoylamino)phenyl]titanium, bis(cyclopentadienyl)bis[2,6-difluoro-3-(N-(2-methoxyethyl)trimethylsilylamino)phenyl]titanium, bis(cyclopentadienyl)bis[2,6-difluoro-3-(N-butylhexyldimethylsilylamino)phenyl]titanium, bis(cyclopentadienyl)bis[2,6-difluoro-3-(N-ethyl-(1,1,2-tolylmethylpropyl)dimethylsilylamino)phenyl]titanium, bis(cyclopentadienyl)bis[2,6-difluoro-3-(3-ethoxymethyl-3-methyl-2-azethiodinon-1-yl)phenyl]titanium, bis(cyclopentadienyl)bis[2,6-difluoro-3-(3-allyloxymethyl-3-methyl-2-azethidinon-1-yl)phenyl]titanium, bis(cyclopentadienyl)bis[2,6-difluoro-3-(3-chloromethyl-3-methyl-2-azethidinon-1-yl)phenyl]titanium, bis(cyclopentadienyl)bis[2,6-difluoro-3-(N-benzyl-2,2-dimethylpropanoylamino)phenyl]titanium, bis(cyclopentadienyl)bis[2,6-difluoro-3-(5,5-dimethyl-2-pyrrolidino-1-yl)phenyl]titanium, bis(cyclopentadienyl)bis[2,6-difluoro-3-(6,6-diphenyl-2-piperidinon-1-yl)phenyl]titanium, bis(cyclopentadienyl)bis[2,6-difluoro-3-(N-2,3-dihydro-1,2-benzinthiazolo-3-one(1,1-dioxide)-2-yl)phenyl]titanium, bis(cyclopentadienyl)bis[2,6-difluoro-3-(N-hexyl-(4-chlorobenzoyl)amino)phenyl]titanium, bis(cyclopentadienyl)bis[2,6-difluoro-3-(N-hexyl-(2-chlorobenzoyl)amino)phenyl]titanium, bis(cyclopentadienyl)bis[2,6-difluoro-3-(N-isopropyl-(4-chlorobenzoyl)amino)phenyl]titanium, bis(cyclopentadienyl)bis[2,6-difluoro-3-(N-(4-methylphenylmethyl)-(4-chlorobenzoyl)amino)phenyl]titanium, bis(cyclopentadienyl)bis[2,6-difluoro-3-(N-(4-methylphenylmethyl)-(2-chlorobenzoyl)amino)phenyl]titanium, bis(cyclopentadienyl)bis[2,6-difluoro-3-(N-butyl-(4-chorobenzoyl)amino)phenyl]titanium, bis(cyclopentadienyl)bis[2,6-difluoro-3-(N-benzyl-2,2-dimethylpentanoylamino)phenyl]titanium, bis(cyclopentadienyl)bis[2,6-difluoro-3-(N-(2-ethylhexyl)-4-tolyl-sulfonyl)amino)phenyl]titanium, bis(cyclopentadienyl)bis[2,6-difluoro-3-(N-(3-oxaheptyl)benzoylamino)phenyl]titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonyl)amino)phenyl]titanium, bis(cyclopentadienyl)bis[2,6-difluoro-3-(trifluoroacetylamino)phenyl]titanium, bis(cyclopentadienyl)bis[2,6-difluoro-3-(2-chlorobenzoyl)amino)phenyl]titanium, bis(cyclopentadienyl)bis[2,6-difluoro-3-(4-chlorobenzoyl)amino)phenyl]titanium, bis(cyclopentadienyl)bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxyoctyl)benzoylamino)phenyl]titanium and bis(cyclopentadienyl)bis[2,6-difluoro-3-(N-cyclohexylbenzoylamino)phenyl]titanium.

In the present invention, the component B) can be suitably used individually or in combination of two or more thereof.

The amount of the polymerization initiator used is from 0.1 to 50 wt %, preferably from 0.5 to 30 wt %, based on all components.

The photopolymerizable composition of the present invention may contain a visible ray sensitizing dye as the component D). The visible ray sensitizing dye is preferably a compound represented by formula (3):

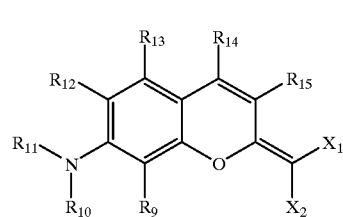

(3)

wherein $R_9$ to $R_{13}$ each independently represents a hydrogen atom, a halogen atom, an alkyl group, an aryl group, an alkenyl group, a hydroxyl group, a substituted oxy group, a mercapto group, an amino group, a substituted carbonyl group, a sulfo group, a sulfonato group, a substituted sulfinyl group, a substituted sulfonyl group, a phosphono group, a phosphonato group, a cyano group, a nitro group or a silyl group, $R_9$ and $R_{10}$ or $R_{11}$ and $R_{12}$ may form a ring comprising a nonmetallic atom together with the carbon atoms to which $R_9$ and $R_{10}$ or $R_{11}$ and $R_{12}$ are bonded, $R_{14}$ and $R_{15}$ each independently represents a hydrogen atom, a halogen atom, an alkyl group, an aryl group, an alkenyl group, a hydroxyl group, a substituted oxy group, a mercapto group, an amino group, a substituted carbonyl group, a sulfo group, a sulfonato group, a substituted sulfinyl group, a substituted sulfonyl group, a phosphono group, a phosphonato group, a cyano group, a nitro group, a silyl group or a heterocyclic group, $R_{13}$ and $R_{14}$ or $R_{14}$ and $R_{15}$ may form a ring comprising a nonmetallic atom together with the carbon atoms to which $R_{13}$ and $R_{14}$ or $R_{14}$ and $R_{15}$ are bonded, $X_1$ and $X_2$ each represents a cyano group or a substituted carbonyl group, and $X_1$ and $X_2$ may be combined to form a ring.

Specific examples of the substituent are the same as those described above in relation to formulae (1) and (2).

The substituted thio group ($R_{O12}S$—) which can be used includes those where $R_{O12}$ is a group comprising a monovalent nonmetallic atom group exclusive of a hydrogen atom. Preferred examples of the substituted thio group include an alkylthio group, an arylthio group, an alkyldithio group, an aryldithio group and an acylthio group. The alkyl group and the aryl group in these groups include those described above for the alkyl group and the substituted alkyl group and those for the aryl group and the substituted aryl group, respectively. $R_{O7}$ in the acyl group ($R_{O7}CO$—) of the acylthio group is the same as described above. Among these, an alkylthio group and an arylthio group are more preferred. Specific examples of preferred substituted thio groups include a methylthio group, an ethylthio group, a phenylthio group, an ethoxyethylthio group, a carboxyethylthio group and a methoxycarbonylthio group.

The substituted carbonyl group ($R_{O13}$—CO—) which can be used includes those where $R_{O13}$ is a group comprising a monovalent nonmetallic atom group. Preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N'-arylcarbamoyl group. The alkyl group and the aryl group in these groups include those described above for the alkyl group and the substituted alkyl group and those for the aryl group and the substituted aryl group, respectively. Among these, more preferred are a formyl group, an acyl group, a carboxyl group, an alkoxycarbonyl group, an aryloxycarbonyl group, a carbamoyl group, an N-alkylcarbamoyl group, an N,N-dialkylcarbamoyl group and an N-arylcarbamoyl group, still more preferred are a formyl group, an acyl group, an alkoxycarbonyl group and an aryloxycarbonyl group. Specific examples of preferred substituted carbonyl groups include a formyl group, an acetyl group, a benzoyl group, a carboxyl group, a methoxycarbonyl group, an ethoxycarbonyl group, an allyloxycarbonyl group, a dimethylaminophenyl ether carbonyl group, a methoxycarbonylmethoxycarbonyl group, an N-methylcarbamoyl group, an N-phenylcarbamoyl group, an N,N-diethylcarbamoyl group and a morpholinocarbonyl group.

The substituted sulfinyl group ($R_{O14}$—SO—) which can be used includes those where $R_{O14}$ is a group comprising a monovalent nonmetallic atom group. Preferred examples thereof include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group and an N-alkyl-N-arylsulfinamoyl group. The alkyl group and the aryl group in these groups include those described above for the alkyl group and the substituted alkyl group and those for the aryl group and the substituted aryl group, respectively. Among these, more preferred are an alkylsulfinyl group and an arylsulfinyl group. Specific examples of the substituted sulfinyl group include a hexylsulfinyl group, a benzylsulfinyl group and a tolylsulfinyl group.

The substituted phosphono group is a phosphono group on which one or more hydroxyl groups are substituted by an organic oxo group. Preferred examples thereof include a dialkylphosphono group, a diarylphosphono group, an alkylarylphosphono group, a monoalkylphosphono group and a monoarylphosphono group, which are described above. Of these, more preferred are a dialkylphosphono group and a diarylphosphono group. Specific examples thereof include diethylphosphono group, a dibutylphosphono group and a diphenylphosphono group.

The phosphonato group (—$PO_3^{2-}$, —$PO_3H^-$) is a conjugated base anion group derived from the acid first dissociation or acid second dissociation of a phosphono group (—$PO_3H_2$) as described above and in usual, the phosphonato group is preferably used together with a counter cation. Examples of the counter cation include generally known ones such as various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphonato group is a conjugated base anion group of the above-described substituted phosphono group in which one of the hydroxyl groups is substituted by an organic oxo group. Specific examples thereof include conjugated bases of a monoalkylphosphono group (—$PO_3H$(alkyl)) or a monoarylphosphono group (—$PO_3H$(aryl)) described above.

Specific examples of the heterocyclic group represented by $R_{14}$ or $R_{15}$ include a 5- or 6-membered heterocyclic group which may have a condensed ring and specific examples thereof include a benzothiazolyl group, a benzoimidazolyl group and a 2,5-dioxo-3-pyrrolinyl group.

$R_9$ and $R_{10}$ or $R_{11}$ and $R_{12}$ may be combined to each other to form a ring and the ring formed is preferably a 5- or 6-membered alicyclic ring. The rings may further be condensed to each other.

$R_{13}$ and $R_{14}$ or $R_{14}$ and $R_{15}$ may be combined to form a ring and the ring formed is preferably a 5- or 6-membered alicyclic ring.

$R_9$, $R_{12}$ and $R_{13}$ each is preferably a hydrogen atom.

$R_{10}$ and $R_{11}$ each is preferably a hydrogen atom or an alkyl group.

$R_{14}$ and $R_{15}$ each is preferably a hydrogen atom, an alkyl group, a halogen-substituted alkyl group, a hydroxyl group, a cyano group, an alkenyl group, an aryl group, a heterocyclic group, a substituted oxy group or a substituted carbonyl group, more preferably, $R_{14}$ is a hydrogen atom, an alkyl group or a substituted oxy group and $R_{15}$ is a hydrogen atom.

$X_1$ and $X_2$ are preferably combined to form a ring and the ring formed is preferably a cyclic ketone.

Specific examples of the compound are set forth below, however, the present invention is by no means limited thereto.

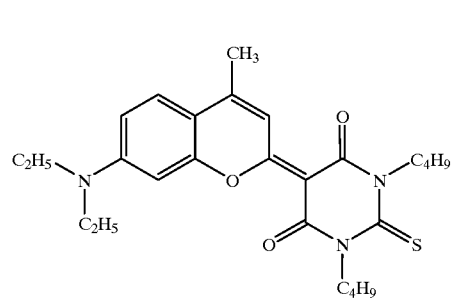

(D-1)

-continued
(D-2)
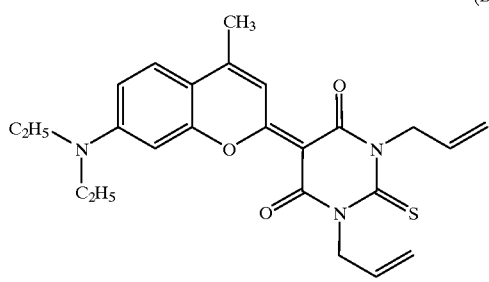
(D-3)
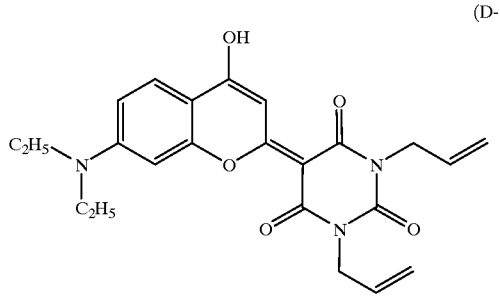
(D-4)
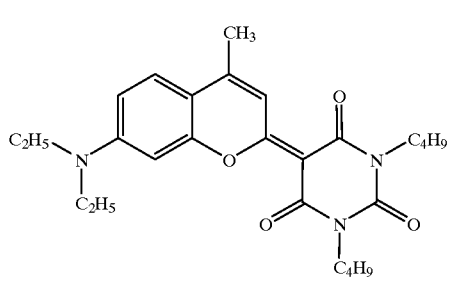
(D-5)
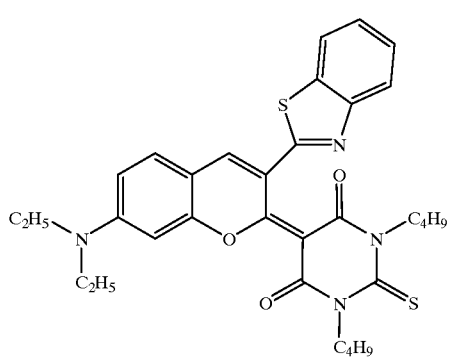
(D-6)
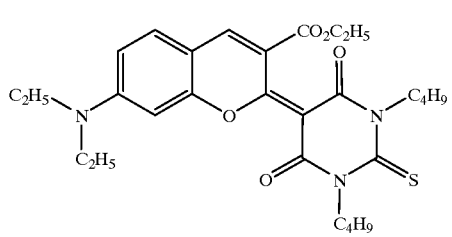
-continued
(D-7)
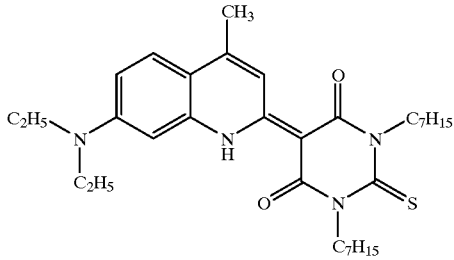
(D-8)
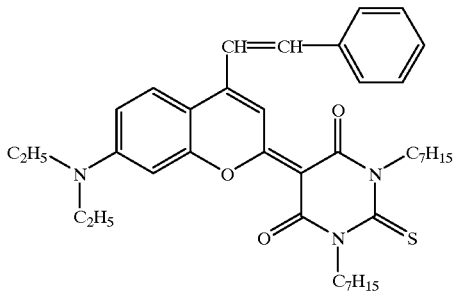
(D-9)
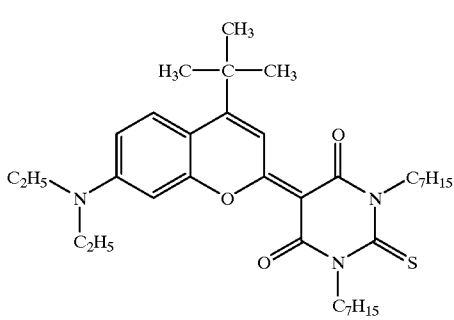
(D-10)
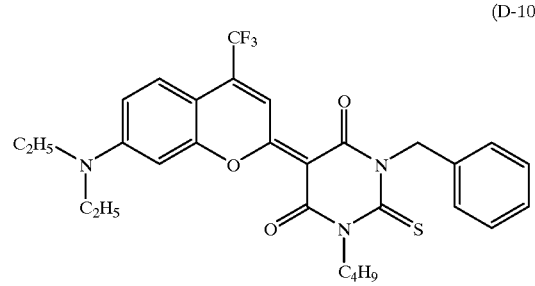
(D-11)
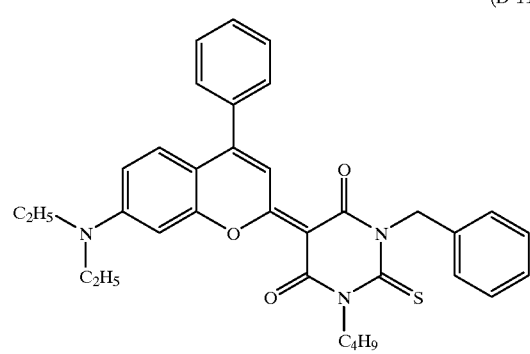

-continued
(D-12)
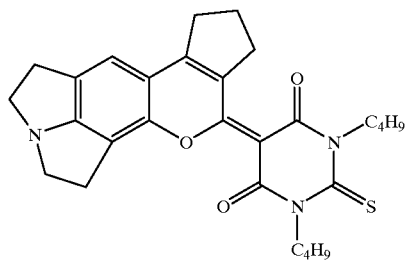
(D-13)
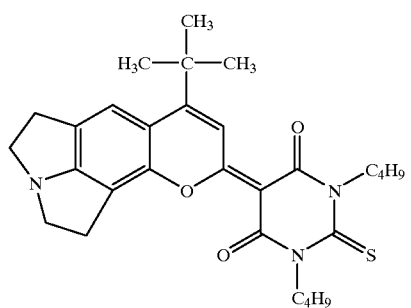
(D-14)
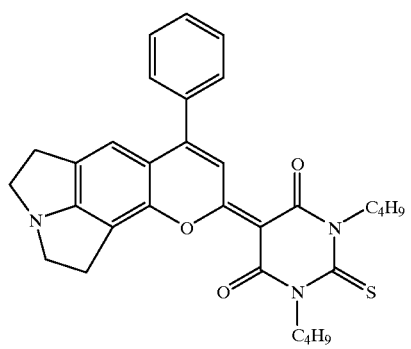
(D-15)
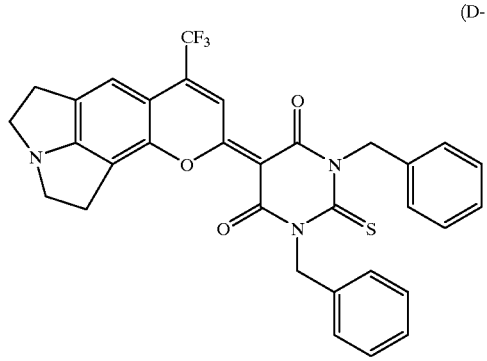
(D-16)
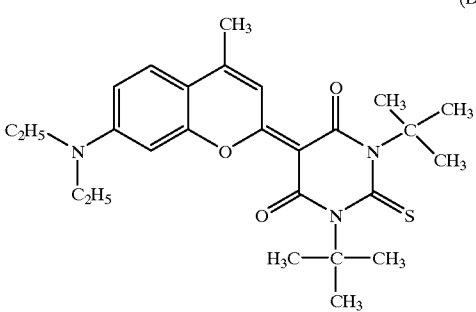
-continued
(D-17)
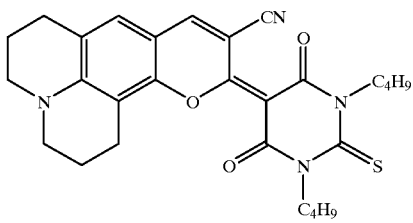
(D-18)
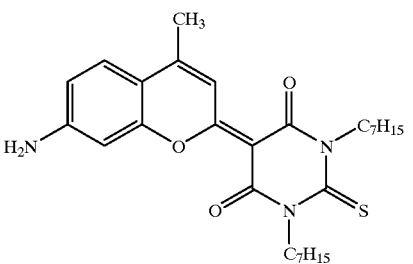
(D-19)
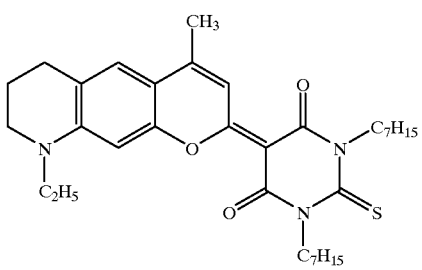
(D-20)
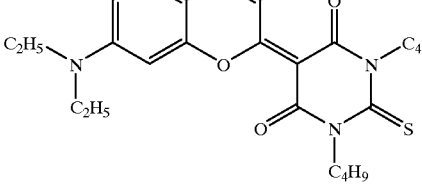
(D-21)
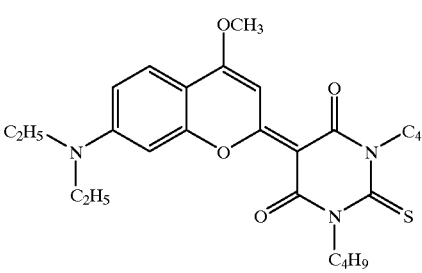
(D-22)
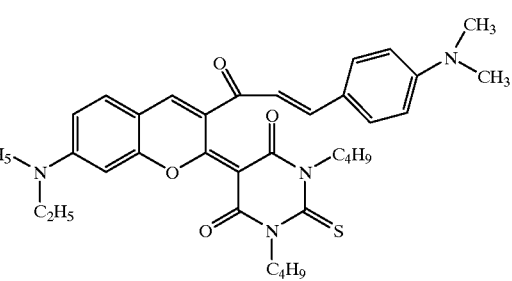

-continued (D-23)
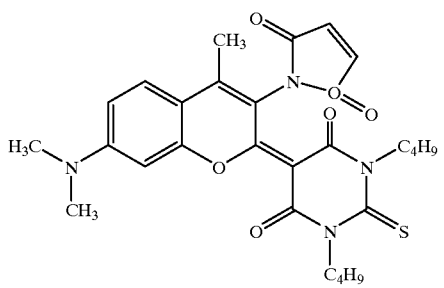

(D-24)
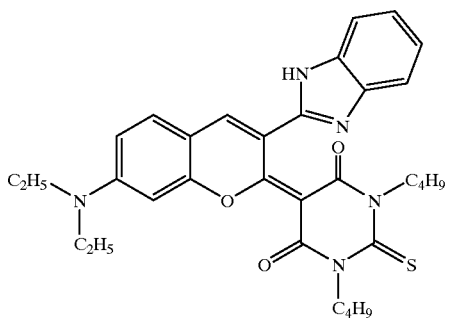

(D-25)
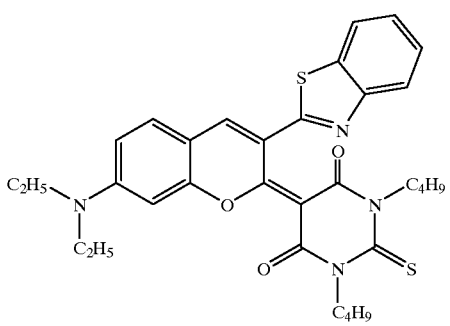

(D-26)
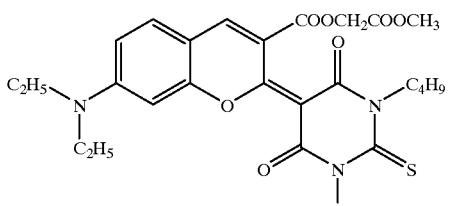

(D-27)
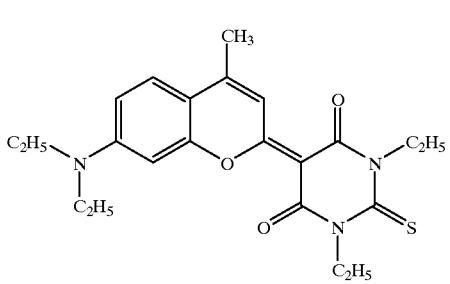

An already known spectral sensitizing dye or dyestuff may also be allowed to be present together as the component D). Preferred examples of the spectral sensitizing dye or dyestuff include polynuclear aromatics (e.g., pyrene, perylene, triphenylene), xanthenes (e.g., fluoroscein, Eosine, erythrosine, Rhodamine B, Rose Bengal), cyanines (e.g., thiacarbocyanine, oxacarbocyanine), merocyanines (e.g., merocyanine, carbomerocyanine), thiazines (e.g., thionine, Methylene Blue, Toluidine Blue), acridines (Acridine Orange, chloroflavin, acriflavine), phthalocyanines (e.g., phthalocyanine, metal phthalocyanine), porphyrins (e.g., tetraphenylporphyrin, metal porphyrin), chlorophyll, chlorophyllin, center metal substituted chlorophyll), metal complexes such as

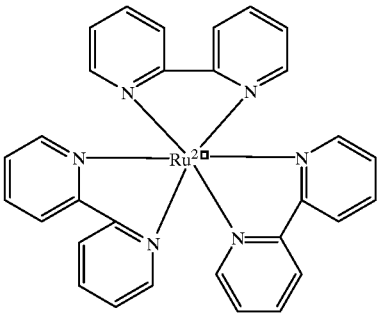

anthraquinones (e.g., anthraquinone) and squaryliums (e.g., squarylium).

More preferred examples of the spectral sensitizing dye or dyestuff as component (iv) include styryl-based dyes described in JP-B-37-13034 such as

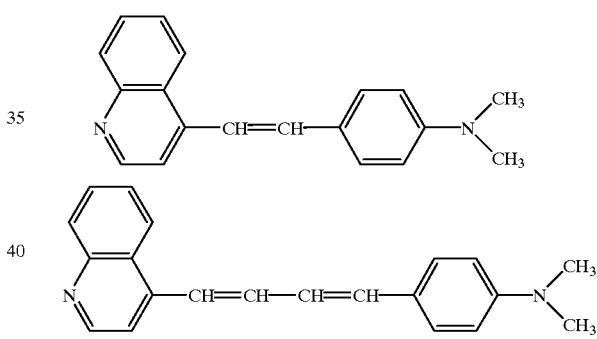

cationic dyes described in JP-A-62-143044 such as

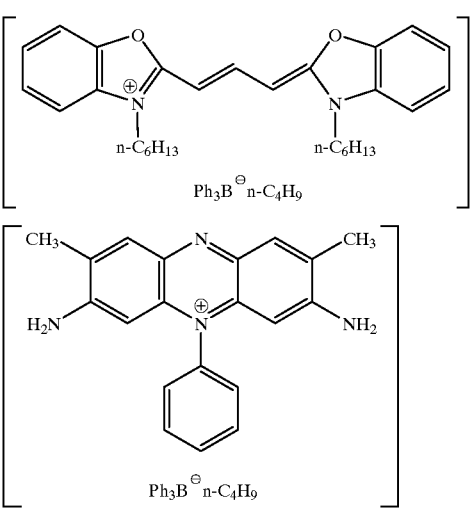

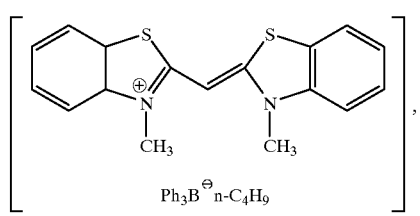
quinoxalinium salts described in JP-A-59-24147 such as
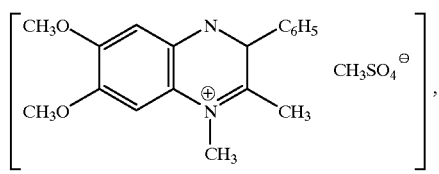
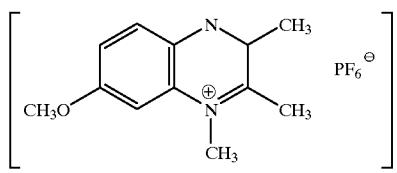
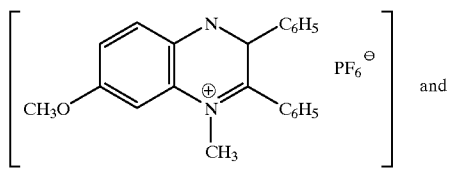 and
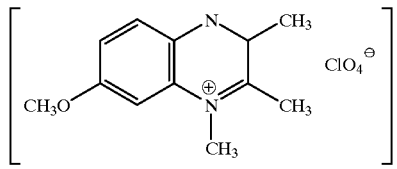
new Methylene Blue compounds described in JP-A-64-33104 such as
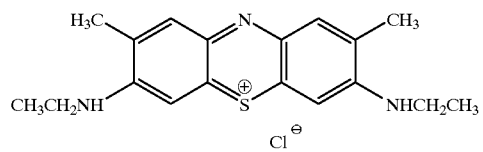
anthraquinones described in JP-A-64–56767 such as
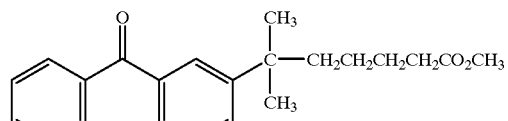
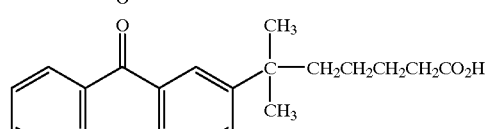
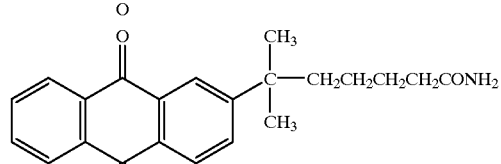
benzoxanthene dyes described in JP-A-2-174, acridines described in JP-A-2-226148 and JP-A-2-226149, such as
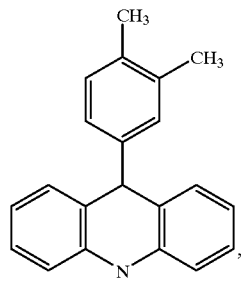

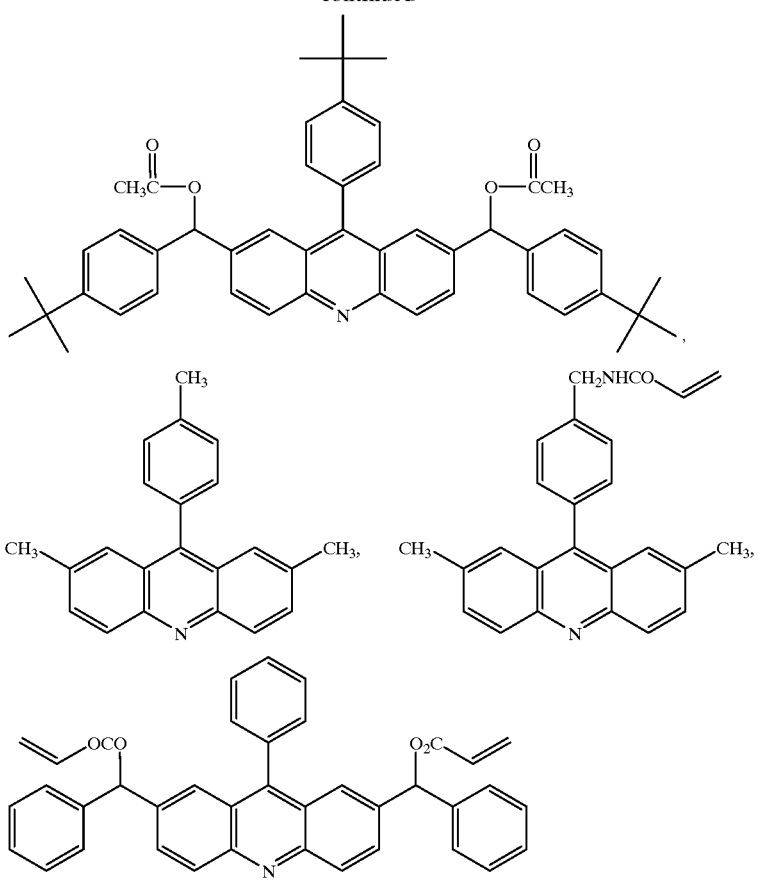
pyrylium salts described in JP-B-40-28499, such as
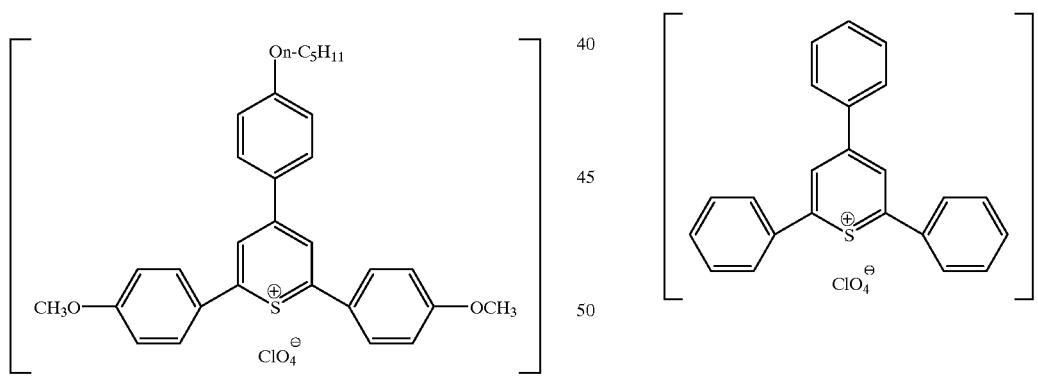
cyanines described in JP-B-46-42363, such as
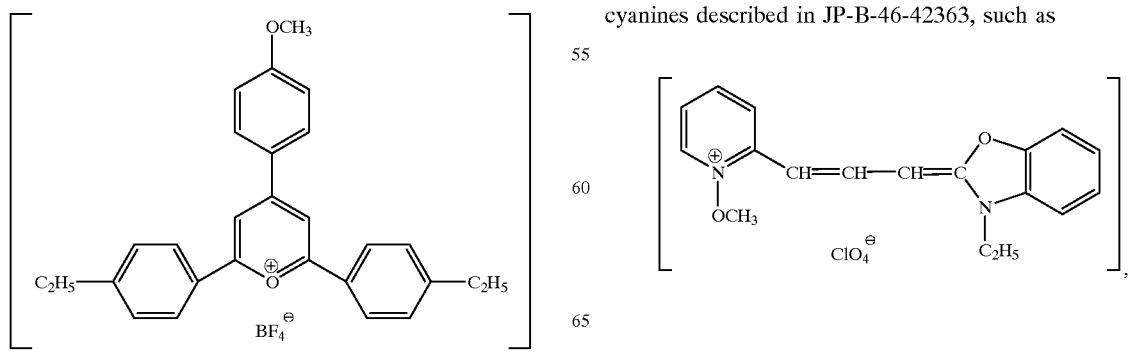

-continued
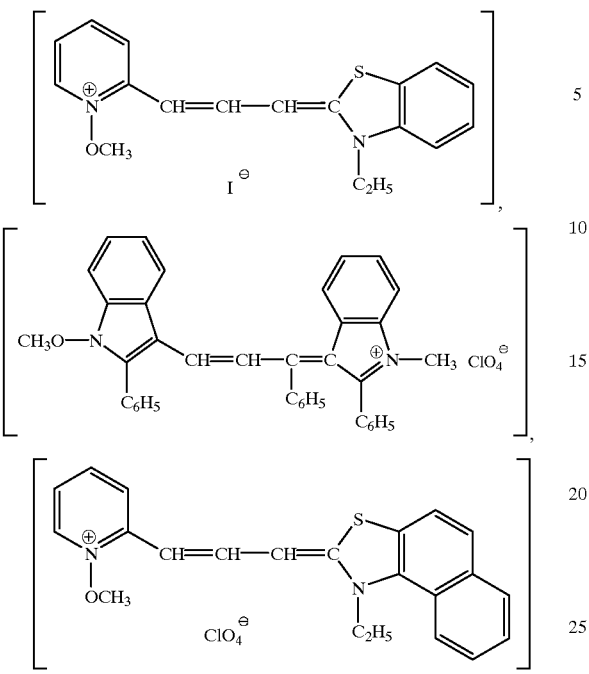
benzofran dyes described in JP-A-2-63053, such as
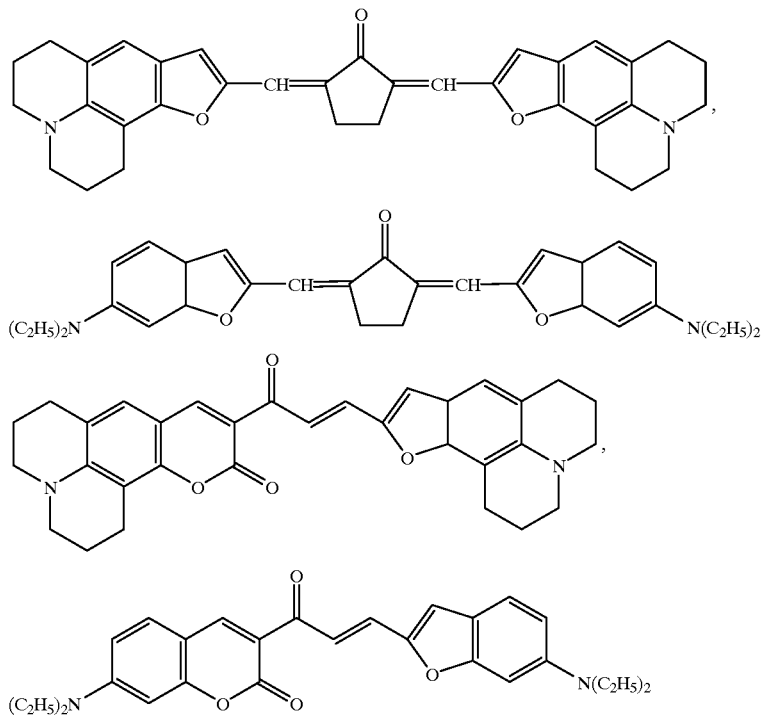
conjugated ketone dyes described in JP-A-2-85858 and JP-A-2-216154 such as

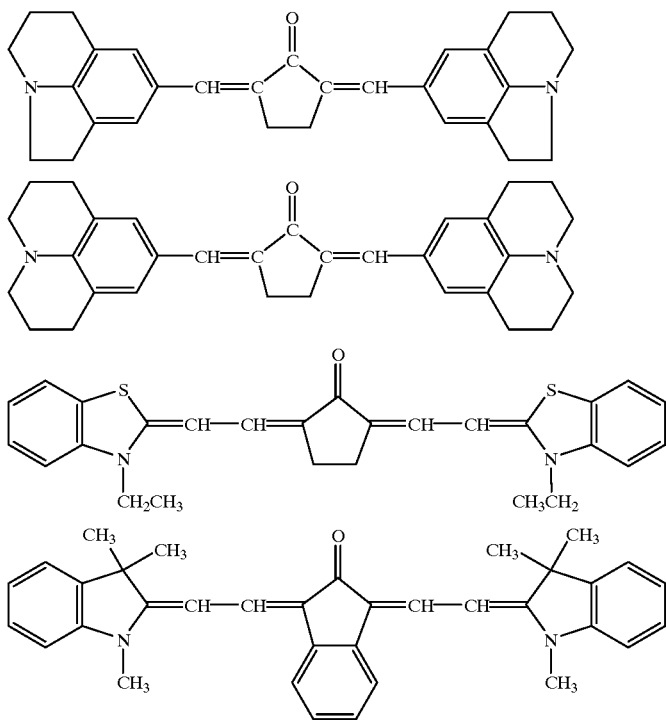
dyes described in JP-A-57-10605, azocinnamylidene derivatives described in JP-B-2-30321, such as
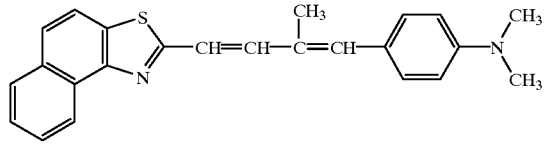
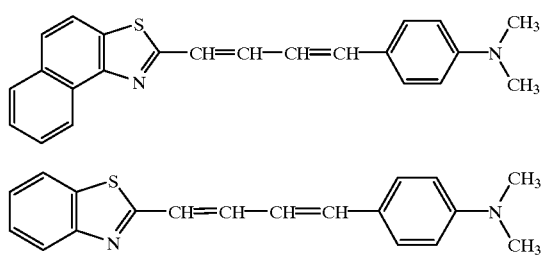
cyanine-based dyes described in JP-A-1-287105, such as
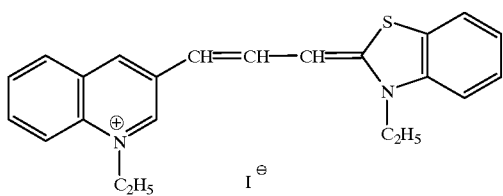
-continued
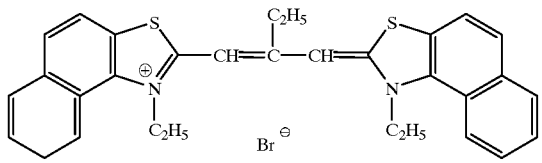
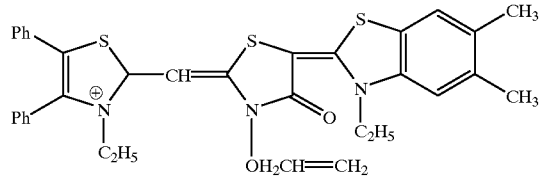
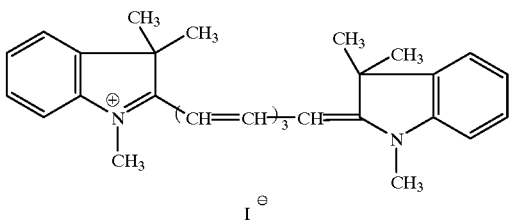
xanthene-based dyes described in JP-A-62-31844, JP-A-62-31848 and JP-A-62-143043, such as

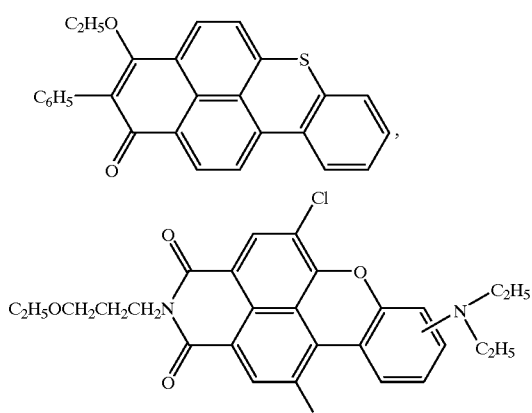
aminostyryl ketones described in JP-B-59-28325, such as
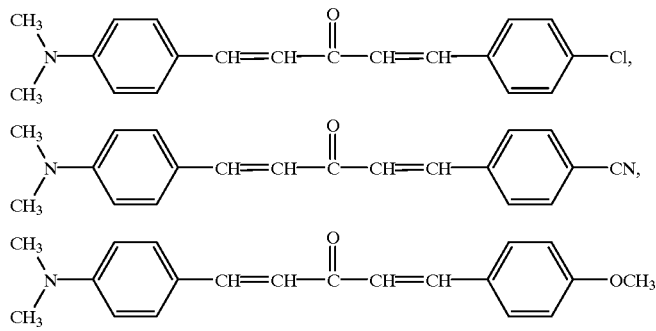
and merocyanine dyes represented by the following formulae (4) to (11) described in JP-B-61-9621:
(4)
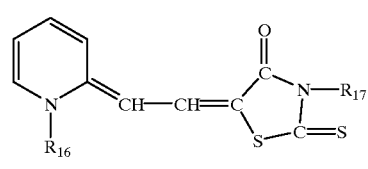
(5)
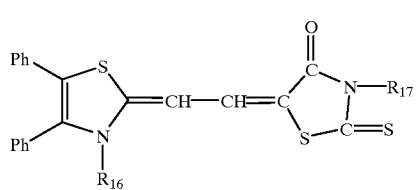
(6)
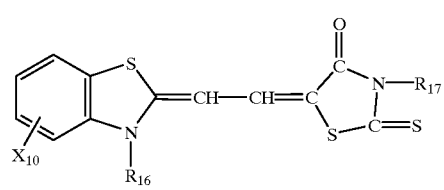
(7)
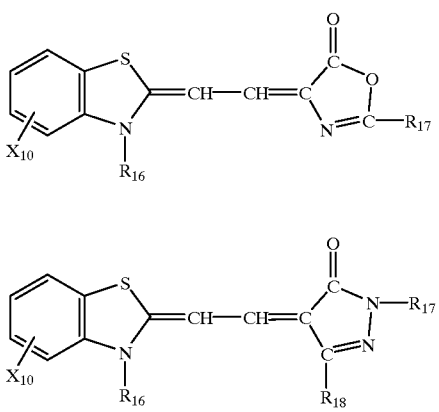
(8)
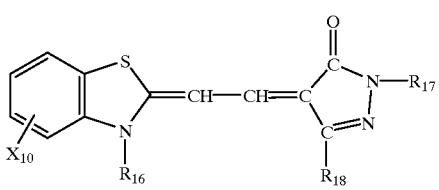
-continued
(9)
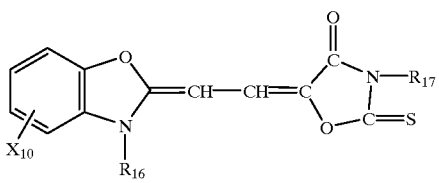
(10)
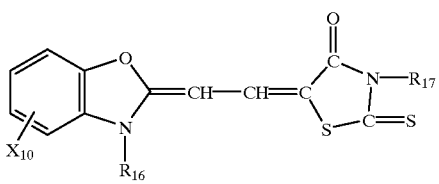
(11)
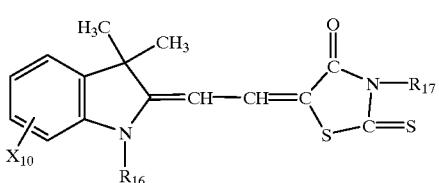
wherein in formulae (6) to (11), $X_{10}$ represents a hydrogen atom, an alkyl group, a substituted alkyl group, an alkoxy group, an aryl group, a substituted aryl group, an aryloxy group, an aralkyl group or a halogen atom; in formula (5), Ph represents a phenyl group; and in formulae (4) to (11), $R_{16}$, $R_{17}$ and $R_{18}$, which may be the same or different, each represents an alkyl group, a substituted alkyl group, an alkenyl group, an aryl group, a substituted aryl group or an alkyl group.

Examples of the merocyanine dye include the dyes represented by the following formulae (12) to (14) described in JP-A-2-179643:

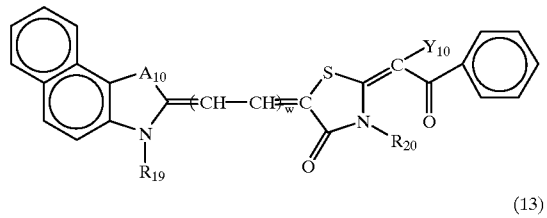
(12)

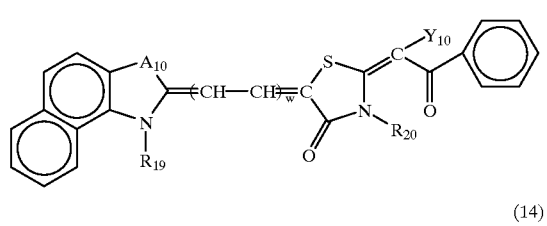
(13)

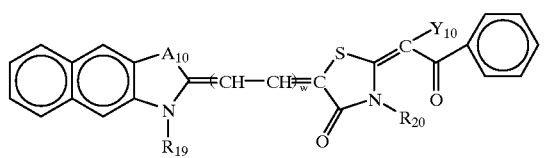
(14)

wherein $A_{10}$ represents an oxygen atom, a sulfur atom, a selenium atom, a tellurium atom, an alkyl- or aryl-substituted nitrogen atom or a dialkyl-substituted carbon atom; $Y_{10}$ represents a hydrogen atom, an alkyl group, a substituted alkyl group, an aryl group, a substituted aryl group, an aralkyl group, an acyl group or a substituted alkoxycarbonyl group; $R_{19}$ and $R_{20}$ each represents a hydrogen atom, an alkyl group having from 1 to 18 carbon atoms or a substituted alkyl group having from 1 to 18 carbon atoms in which the substituent is a halogen atom (e.g., F, Cl, Br,

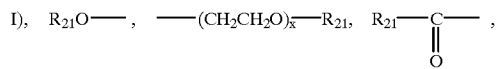

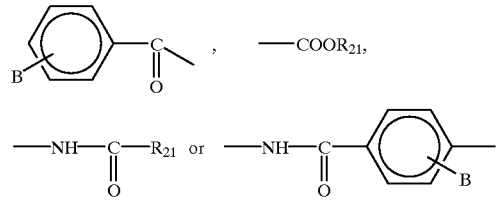

$R_{21}$, represents a hydrogen atom or an alkyl group having from 1 to 10 carbon atoms and B represents a dialkylamino group, a hydroxyl group, an acyloxy group, a halogen atom or a nitro group); w represents an integer of from 0 to 4; and x represents an integer of from 1 to 20.

Further included are the merocyanine dyes represented by the following formula (16) described in JP-A-2-244050:

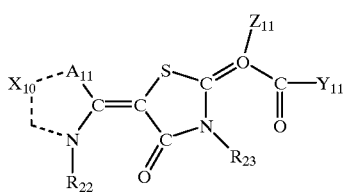
(16)

wherein $R_{22}$ and $R_{23}$ each independently represents a hydrogen atom, an alkyl group, a substituted alkyl group, an alkoxycarbonyl group, an aryl group, a substituted aryl group or an aralkyl group, $A_{11}$ represents an oxygen atom, a sulfur atom, a selenium atom, a tellurium atom, an alkyl- or aryl-substituted nitrogen atom, or a dialkyl-substituted carbon atoms, $X_{11}$ represents a nonmetallic atom group necessary for forming a nitrogen-containing heterocyclic 5-membered ring, $Y_{11}$ represents a substituted phenyl group, an unsustitured or sustitured polynuclear aromahydrocarbocyclic group or an unsubstituted or substituted heteroaromacyclic group, $Z_{11}$ represents a hydrogen atom, an alkyl group, a substituted alkyl group, an aryl group, a sustituted aryl group, an aralkyl group, an alkoxy group, an alkythio group, an arylthio group, a substituted amino group, an acyl group or an alxycarbonyl group, and $Y_{11}$ and $Z_{11}$ may be combined to each other to form a ring.

Specific preferred examples of the merocyanine dye represented by formula (16) include the following:

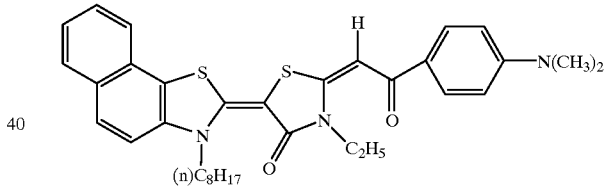

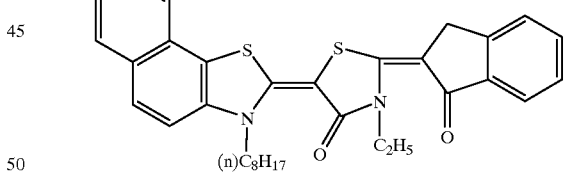

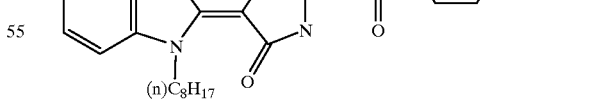

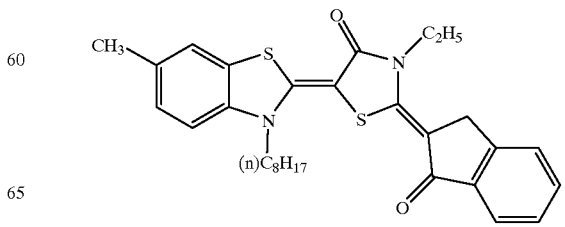

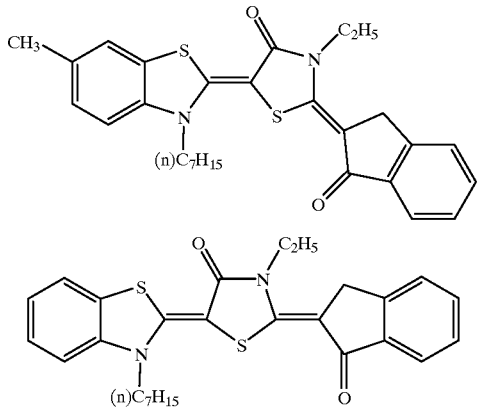

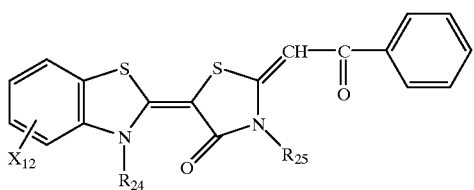

Further included are the merocyanine dyes represented by the following formula (17) described in JP-B-59-28326:

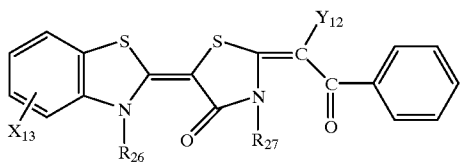

(17)

wherein $R_{24}$ and $R_{25}$, which may be the same or different, each represents a hydrogen atom, an alkyl group, a substituted alkyl group, an aryl group, a substituted aryl group or an aralkyl group; and $X_{12}$ represents a substituent having a Hammett's σ value of from −0.9 to +0.5.

Further included are the merocyanine dyes represented by the following formula (18) described in JP-A-59-89303:

(18)

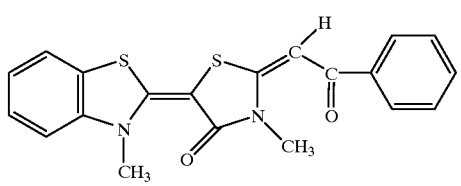

wherein $R_{26}$ and $R_{28}$ each independently represents a hydrogen atom, an alkyl group, a substituted alkyl group, an aryl group, a substituted aryl group or an aralkyl group, $X_{13}$ represents a substituent having a Hammett's σ value of from −0.9 to +0.5, and $Y_{12}$ represents a hydrogen atom, an alkyl group, a substituted alkyl group, an aryl group, a substituted aryl group, an aralkyl group, an acyl group or an alkoxycarbonyl group.

Specific preferred examples of the merocyanine dye represented by formula (18) include the following:

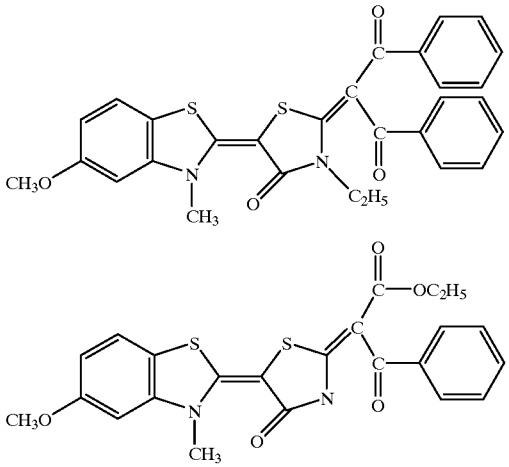

Further included are the merocyanine dyes represented by the following formula (19) described in Japanese Patent Application No. 6-269047:

(19)

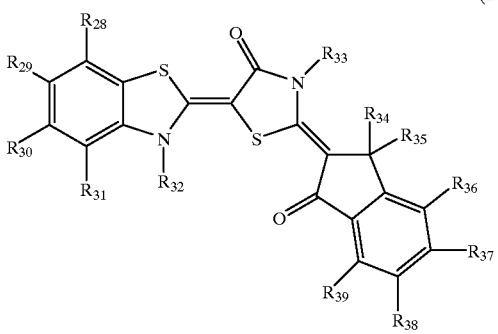

wherein $R_{28}$, $R_{29}$, $R_{30}$, $R_{31}$, $R_{36}$, $R_{37}$, $R_{38}$ and $R_{39}$ each independently represents a hydrogen atom, a halogen atom, an alkyl group, a substituted alkyl group, an aryl group, a substituted aryl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group or a nitro group, $R_{28}$ and $R_{29}$, $R_{29}$ and $R_{30}$, $R_{30}$ and $R_{31}$, $R_{36}$ and $R_{37}$, $R_{37}$ and $R_{38}$ or $R_{38}$ and $R_{39}$ may be combined to each other to form an aliphatic or aromatic ring, $R_{32}$ represents a hydrogen atom, an alkyl group, a substituted alkyl group, an aryl group or a substituted aryl group, $R_{33}$ represents a substituted or unsubstituted alkenylalkyl group or a substituted or unsubstituted alkynylalkyl group, and $R_{34}$ and $R_{35}$ each independently represents a hydrogen atom, a halogen atom, an alkyl group, a substituted alkyl group, an aryl group, a substituted aryl group or a substituted carbonyl group.

More preferred examples of the component D) of the present invention include compounds represented by formula (3) above, the merocyanine dyes described in JP-B-61-9621, merocyanine dyes described in JP-A-2-179643, the merocyanine dyes described in JP-A-2-244050, the merocyanine dyes described in JP-B-59-28326, the merocyanine dyes described in JP-A-59-89303 and the merocyanine dyes described in Japanese Patent Application No.

6-269047. Of these, the compounds represented by formula (3) are still more preferred.

In the present invention, the component D) is suitably used individually or in combination of two or more thereof.

The amount of the sensitizing dye used is from 0.1 to 20 wt %, preferably from 0.3 to 10 wt %, based on all components.

For the purpose of improving the sensitivity, the photopolymerizable composition of the present invention may further contain a photopolymerization co-initiator as the component E). Examples thereof include halogenated hydrocarbon derivatives, ketone compounds, ketooxime compounds, organic peroxides, hexaarylbiimidazole, aromatic onium salts and oxime ethers.

Of these, a system using an oxime ether compound is particularly preferred because of its good capability in the sensitivity, storability, adhesion of the film to the substrate or the like.

Examples of the oxime ether compound which is suitably used in the present invention include the compound represented by the following formula (E):

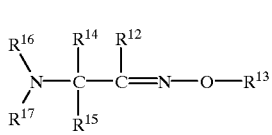
(E)

wherein $R^{12}$ and $R^{13}$, which may be the same or different, each represents a hydrocarbon group which may have a substituent or may contain an unsaturated bond, or a heterocyclic group, $R^{14}$ and $R^{15}$ are bonded to form a ring and represent an alkylene group having from 2 to 8 carbon atoms, which may contain —O—, —NR$^{16}$—, —O—CO—, —NH—CO—, —S— and/or —SO$_2$— on the linking main chain of the ring, and $R^{16}$ and $R^{17}$ each represents a hydrogen atom, a hydrocarbon group which may have a substituent or may contain an unsaturated bond, or a substituted carbonyl group.

Specific examples thereof include the following compounds described in JP-A-8-202035, however, the present invention is by no means limited thereto.

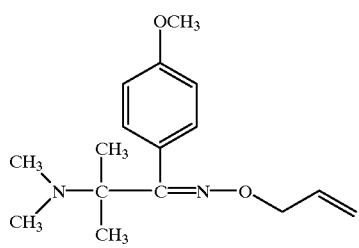
(III-1)

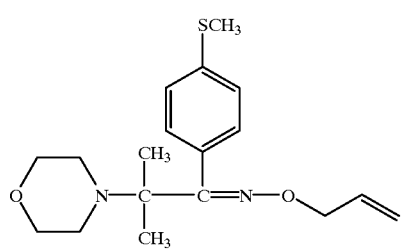
(III-2)

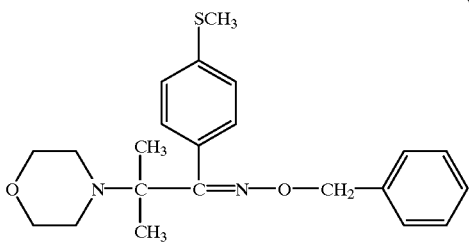
(III-3)

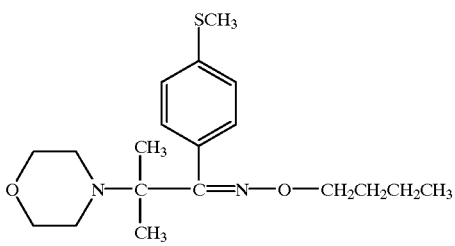
(III-4)

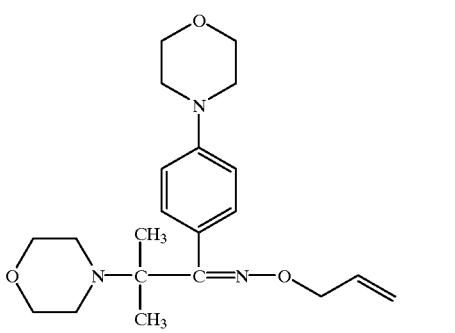
(III-5)

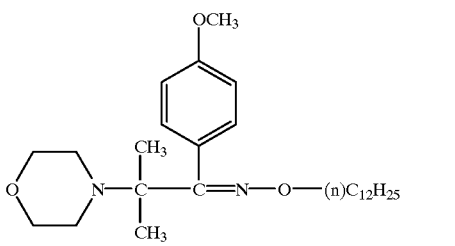
(III-6)

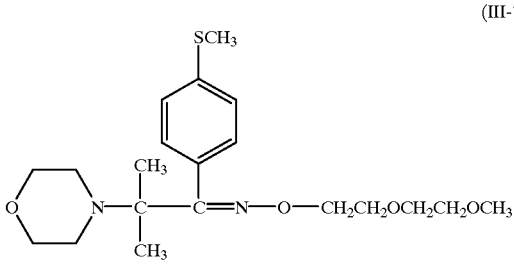
(III-7)

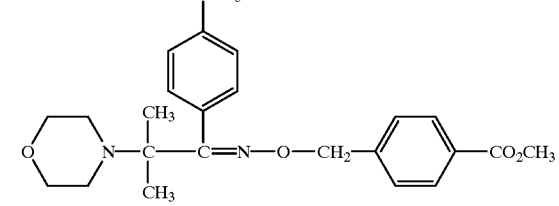
(III-8)

-continued (III-9)
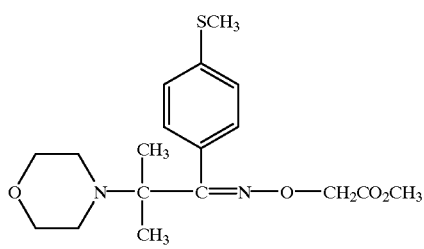

(III-10)
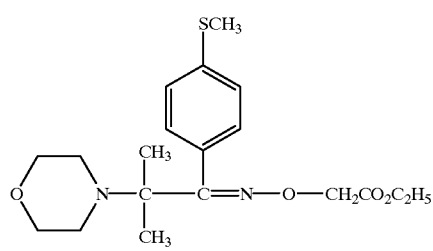

(III-11)
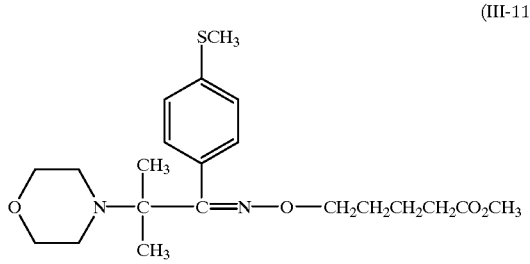

(III-12)
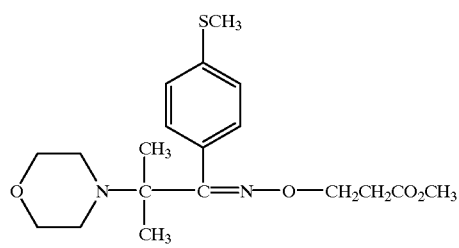

(III-13)
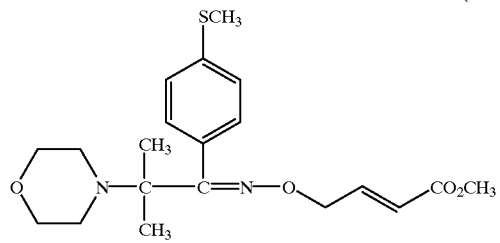

(III-12)
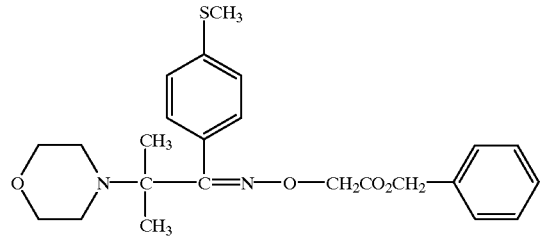

More preferred are the oxime ether compounds represented by the following formula (I):

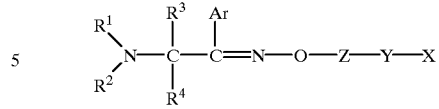
(I)

wherein $R^1$ to $R^4$ each represents an alkyl group or an aryl group, Ar represents an aryl group, $R^1$ and $R^2$ or $R^3$ and $R^4$ may be combined to each other to form a ring, Z represents a hydrocarbon-containing divalent linking group which may have a substituent, and Y represents a divalent linking group containing at least one of the following groups, or a single bond:

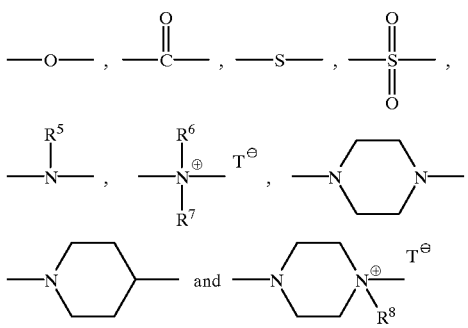

(wherein $R^5$ represents a hydrogen atom, a hydrocarbon group which may have a substituent or may contain an unsaturated bond, a carbonyl group or a sulfonyl group; $R^6$ to $R^8$, which may be the same or different, each represents a hydrocarbon group which may have a substituent or may contain an unsaturated bond; $T^-$ represents a monovalent anion comprising a halogen atom or a monovalent sulfonate anion; and X represents a group having an addition-polymerizable group represented by the following formula (I-a):

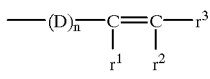
I-a wherein D represents

—O— or

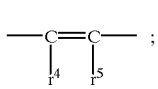;

$r^1$ to $r^3$, which may be the same or different, each represents a hydrogen atom, a methyl group, an ethyl group, a phenyl group, a halogen atom, a cyano group or —C(=O)—$OR^9$; n represents 0 or 1, provided that when n is 0, $r^1$ to $r^3$ are not a hydrogen atom at the same time; $r^4$ and $r^5$, which may be the same or different, each represents a hydrogen atom, a methyl group, an ethyl group or a phenyl group; and $R^9$ represents an alkyl group or an aryl group.

Specific examples thereof include the following compounds described in Japanese Patent Application No. 9-40964, however, the present invention is by no means limited thereto.
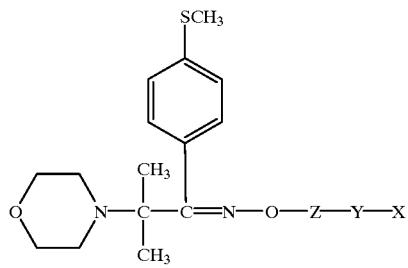
| No. | Structure of —Z—Y—X |
|---|---|
| I-1 | 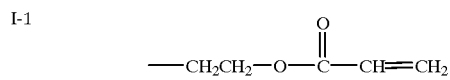 |
| I-2 | 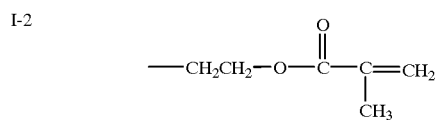 |
| I-3 | 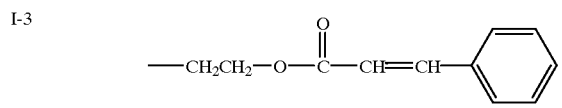 |
| I-4 | 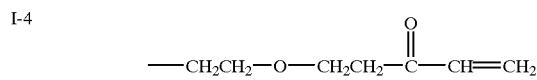 |
| I-5 | 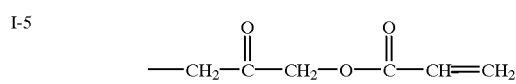 |
| I-6 |  |
| I-7 | 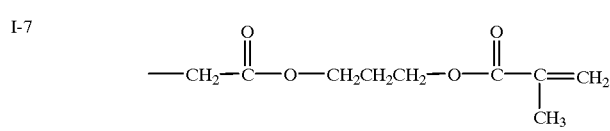 |
| I-8 | 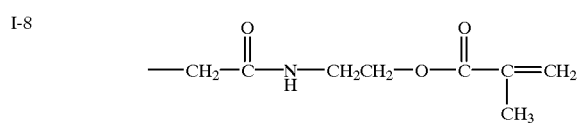 |
| I-9 | 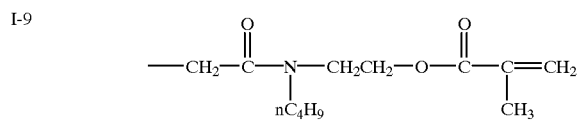 |
| I-10 | 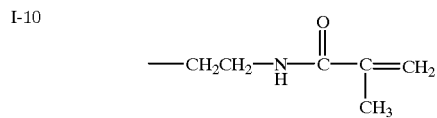 |

-continued
I-11 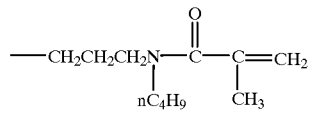
I-12 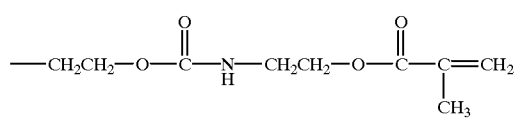
I-13 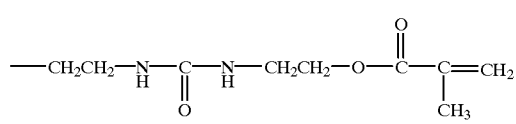
I-14 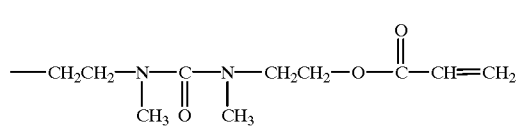
I-15 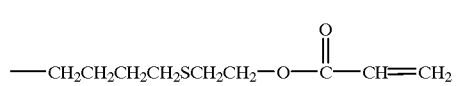
I-16 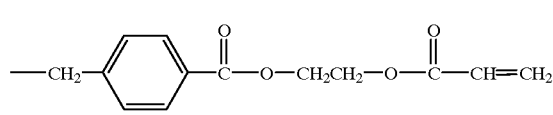
I-17 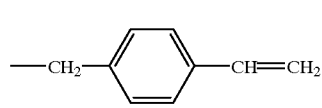
I-18 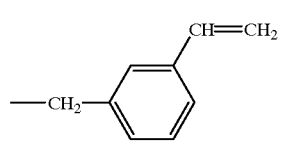
I-19 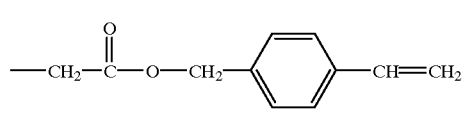
I-20 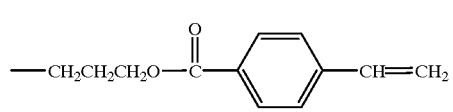
I-21 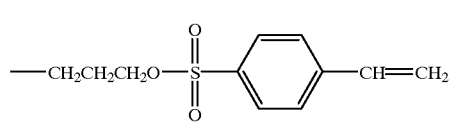
I-22 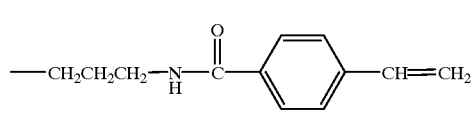
I-23 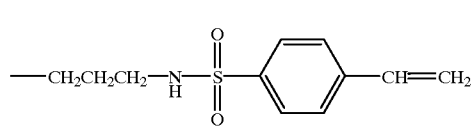

-continued
I-24 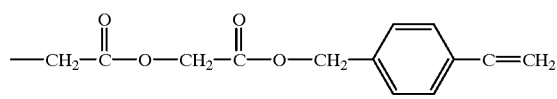
I-25 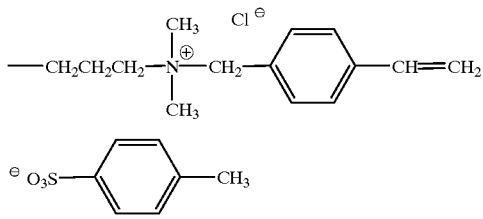
I-26 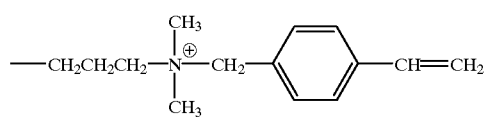
I-27 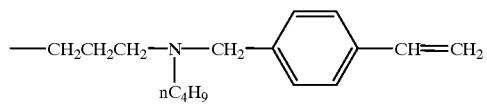
I-28 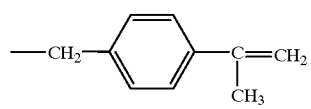
I-29 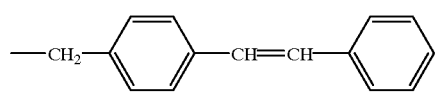
I-30 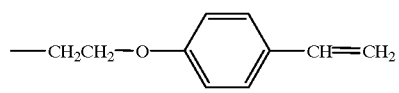
I-31 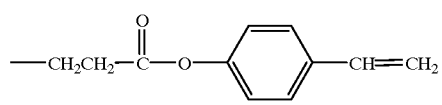
I-32 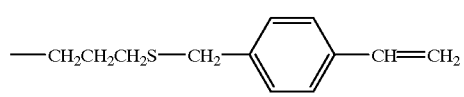
I-33 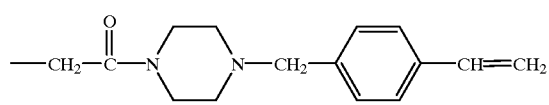
I-34 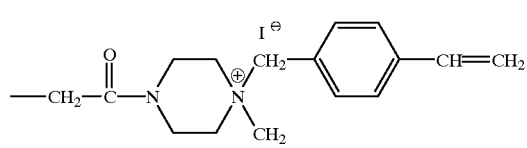
I-35 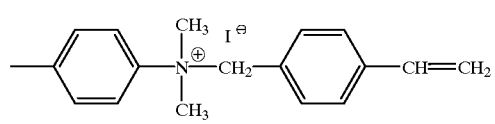

| | |
|---|---|
| I-36 | 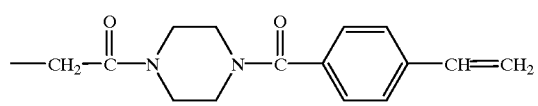 |
| I-37 | 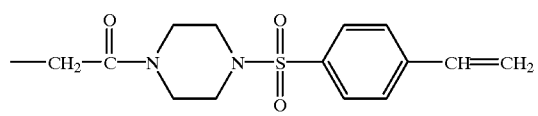 |
| I-38 |  |
| I-39 | 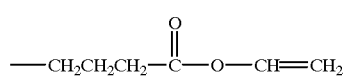 |
| I-40 | 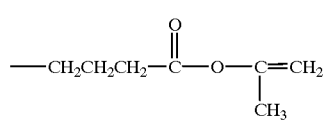 |
| I-41 | 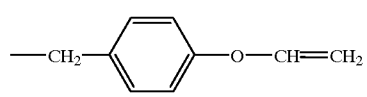 |
| I-42 | 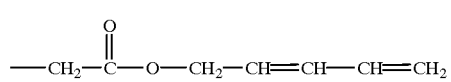 |
| I-43 | 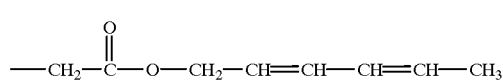 |
| I-44 |  |
| I-45 | 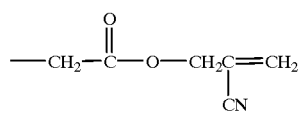 |
| I-46 | 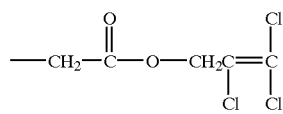 |
| I-47 | 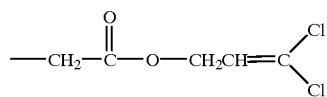 |
| I-48 | 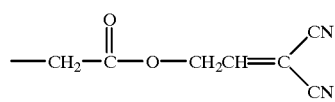 |
| I-49 | 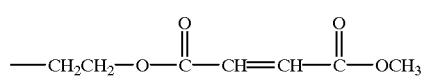 |
| I-50 | 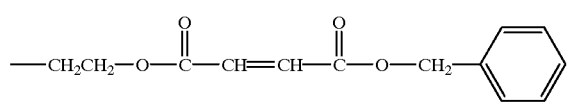 |

-continued
I-51 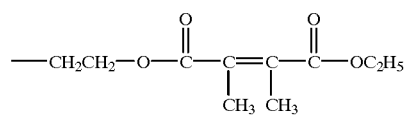
I-52 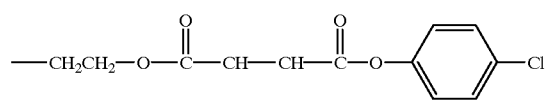
I-53 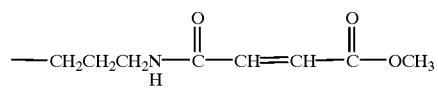
I-54 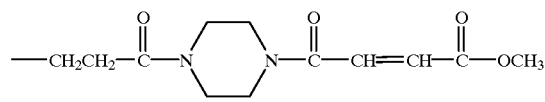
I-55 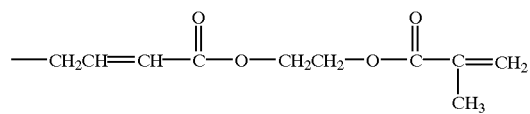
I-56 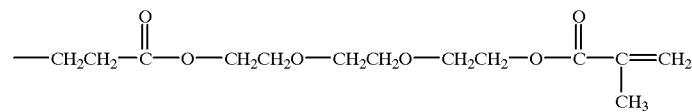
I-57 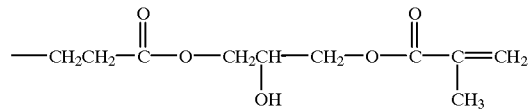
I-58 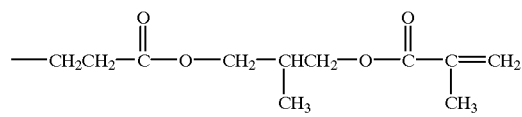
I-59 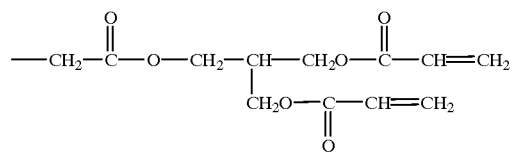
I-60 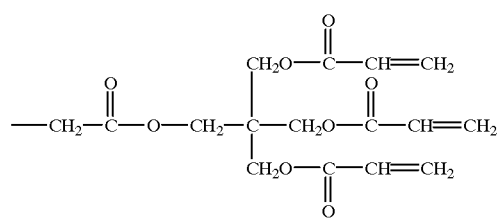

-continued
I-61 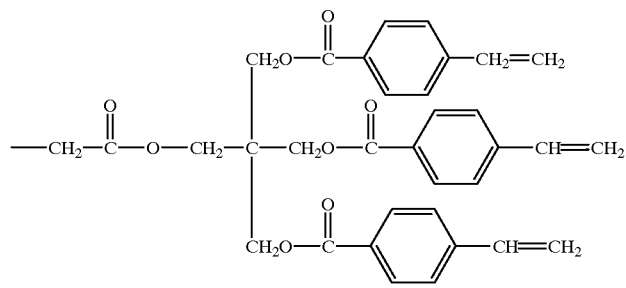
I-62 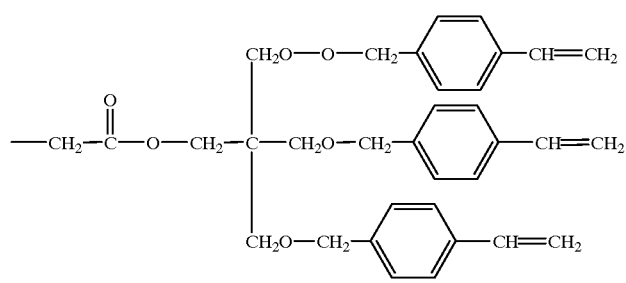
I-63 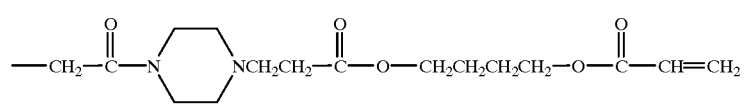
I-64 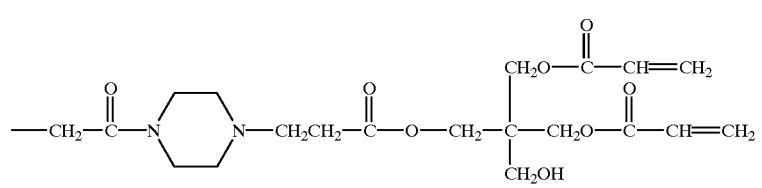
I-65 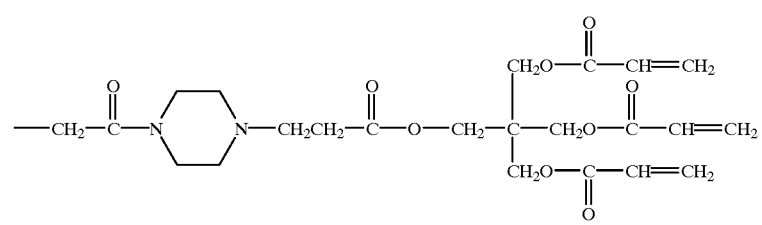
I-66 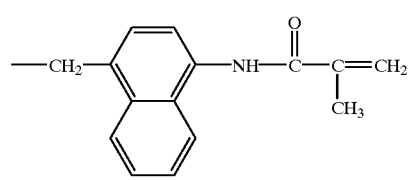
I-67 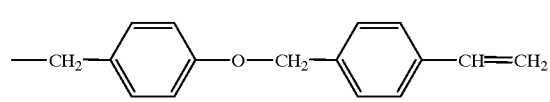
I-68 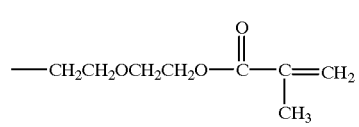

-continued
I-69 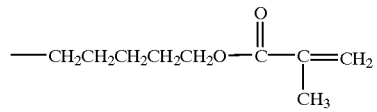
I-70 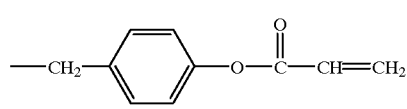
I-71 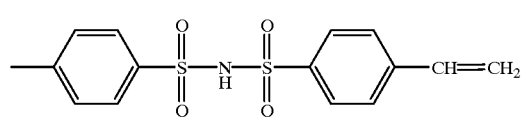
I-72 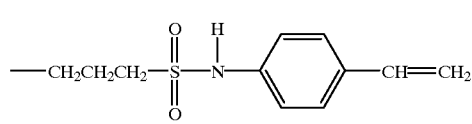
I-73 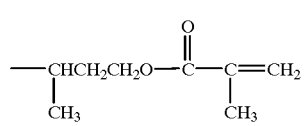
I-74 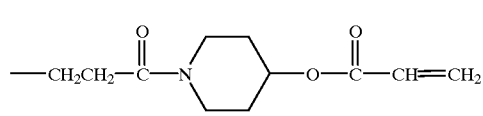
I-75 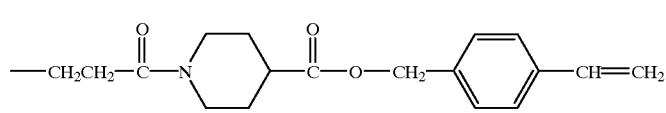
I-76 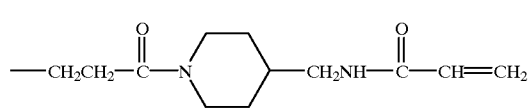
I-77 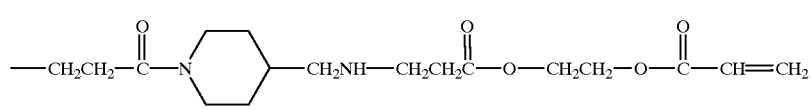
I-78 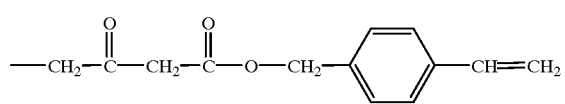
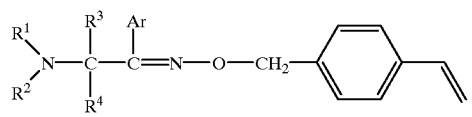
| Compound No. | —$R^1$ | —$R^2$ | —$R^3$ | —$R^4$ | —Ar |
|---|---|---|---|---|---|
| I-79 | —$CH_3$ | —$CH_3$ | —$CH_3$ | —$CH_3$ | 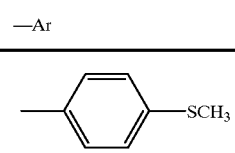 |

-continued

| | | | | | |
|---|---|---|---|---|---|
| I-80 | —CH₃ | —CH₃ | —CH₂—C₆H₄(CH₃) | —CH₃ | 4-SCH₃-C₆H₄— |
| I-81 | —CH₃ | —CH₃ | —CH₂—C₆H₄(CH₃) | —ⁿC₃H₇ | —C₆H₅ |
| I-82 | —C₂H₅ | —CH₃ | —CH₃ | —CH₂CH₂OCH₃ | 4-OCH₃-C₆H₄— |
| I-83 | —C₂H₅ | —C₂H₅ | —C₂H₅ | —C₂H₅ | 4-Cl-C₆H₄— |
| I-84 | —ⁿC₄H₉ | —ⁿC₄H₉ | —CH₂—C₆H₅ | —CH₂—C₆H₅ | 4-(SO₂CH₃)-C₆H₄— |
| I-85 | —CH₂CH₂OH | —CH₂CH₂OH | —CH₃ | —CH₃ | 3-CN-C₆H₄— |
| I-86 | —CH₂CH₂OCH₃ | —CH₂CH₂OCH₃ | —CH₃ | —CH₃ | 2,4-(OCH₃)₂-C₆H₃— |
| I-87 | —CH₂CH₂CN | —CH₂CH₂CN | —CH₃ | —CH₃ | 2,4-(SCH₃)₂-C₆H₃— |
| I-88 | —C₆H₅ / —C₆H₅ | —CH₃ / —C₂H₅ | —CH₃ / —CH₂CH=CH₂ | —CH₃ / —CH₃ | 4-OCH₃-C₆H₄— / 4-OCH₃-C₆H₄— |
| I-89 | —CH₃ | —CH₃ | —CH₂—C₆H₄(4-Cl) | —CH₃ | 4-morpholino-C₆H₄— |
| I-90 | —CH₃ | —ⁿC₄H₉ | —CH₂—C₆H₄(4-OCH₃) | —CH₃ | 4-OCH₃-C₆H₄— |

I-91
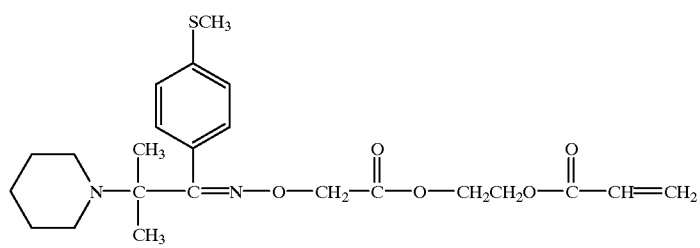
I-92
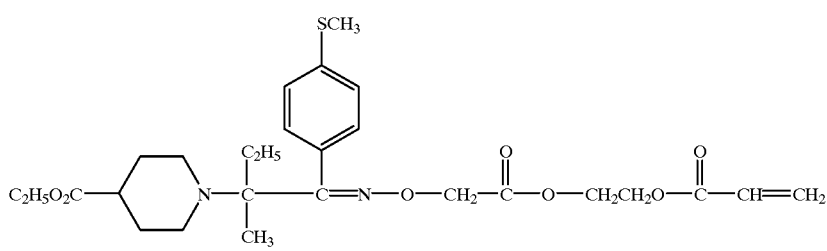
I-93
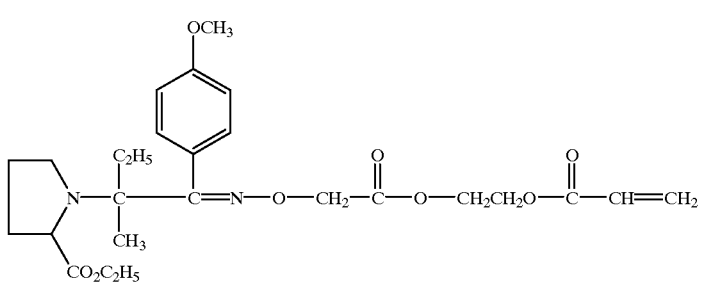
I-94
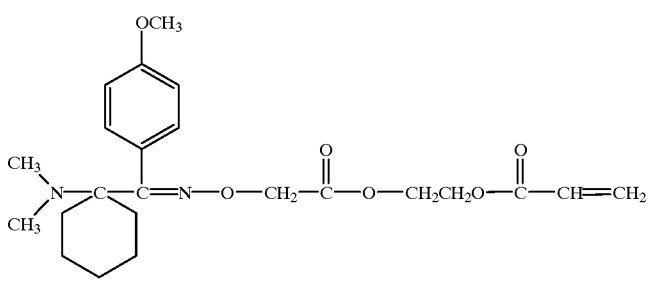
I-95
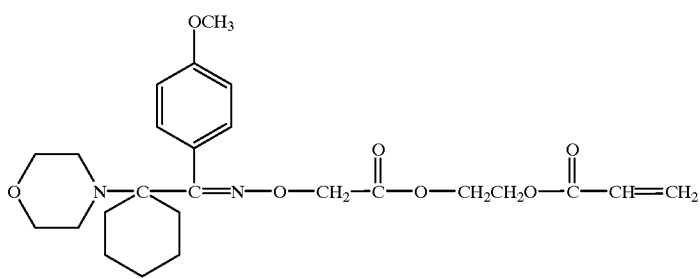

-continued

I-96

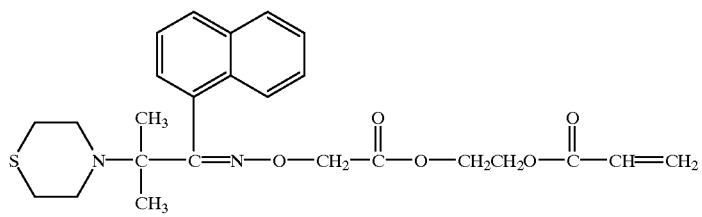

These photopolymerization co-initiators may be used either individually or in combination of two or more thereof. The amount of the polymerization co-initiator used is from 0.1 to 50 wt %, preferably from 0.5 to 30 wt %, based on all components.

In the present invention, another copolymerizable monomer may be copolymerized so as to modify the properties of the photopolymerization composition within the range of not impairing the capability of the composition.

Examples of the copolymerizable monomer include acrylic acid esters such as methyl acrylate, ethyl acrylate, n-propyl acrylate, n-butyl acrylate and n-hexyl acrylate, methacrylic acid esters such as methyl methacrylate, ethyl methacrylate, n-butyl methacrylate and n-hexyl methacrylate, and vinyl compounds such as vinyl chloride, acrylonitrile, styrene and vinyl acetate.

The amount of this monomer component used in the copolymer is within 30 mol %, preferably within 20 mol %.

The above-described copolymer of the present invention has a weight average molecular weight of from 10,000 to 1,000,000. If the weight average molecular weight is less than 10,000, the solubility in a developer becomes excessively high and an image is liable to disappear at the development, whereas if it exceeds 1,000,000, the developability is deteriorated and scumming of background readily occurs.

In addition to these fundamental components of the photopolymerizable composition of the present invention described in the foregoing, it is preferred to add a slight amount of thermopolymerization inhibitor so as to inhibit unnecessary thermopolymerization of the polymerizable ethylenically unsaturated compound during preparation or storage of the photosensitive composition. Suitable examples of the thermopolymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitrosophenylhydroxyamine primary cerium salt. The amount of the thermopolymerization inhibitor used is preferably from about 0.01 wt % to about 5 wt % based on the weight of the entire composition. If desired, a higher fatty acid derivative such as behenic acid or behenic acid amide may be added and allowed to be omnipresent on the surface of the photosensitive layer in the process of drying after the coating, so as to prevent polymerization inhibition by oxygen. The amount of the higher fatty acid derivative added is preferably from about 0.5 to about 10 wt % based on the entire composition. Furthermore, a dyestuff or pigment may also be added for the purpose of coloring the photosensitive layer. Examples of the coloring agent include pigments such as phthalocyanine-based pigment, azo-based pigment, carbon black and titanium oxide, Ethyl Violet, Crystal Violet, azo-based dyes, anthraquinone-based dyes and cyanine-based dyes. The amount of the dyestuff or pigment added is preferably from about 0.5 to about 5 wt % based on the entire composition. In order to improve the physical properties of the cured film, an inorganic filler or other known additives such as plasticizer may also be added.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin, and when a binder is used, the plasticizer may be added in an amount of 10 wt % or less based on the total weight of the ethylenic compound and the binder.

The photopolymerizable composition of the present invention is usually used by coating it on a support. In coating the photopolymerizable composition of the present invention on a support, the composition is dissolved in an organic solvent of various types before use. Examples of the solvent used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50% by weight. The coverage thereof, in terms of the weight after drying, is preferably from about 0.1 to about 10 g/m$^2$, more preferably from 0.5 to 5 g/m$^2$.

As the above-described support, a dimensionally stable, plate-like material is used. Examples of the dimensionally stable, plate-like material include paper, paper laminated with plastics (e.g., polyethylene, polypropylene, polystyrene), sheet of a metal such as aluminum (including aluminum alloy), zinc and copper, a plastic film such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal, and paper or plastic film laminated with or having evaporated thereon the above-described metal. Among these supports, an aluminum plate is particularly preferred because it is dimensionally stable to an extreme extent and in addition, inexpensive. Also, a composite sheet obtained by bonding an aluminum sheet on a polyethylene terephthalate film described in JP-B-48-18327 is preferred.

In the case of a support having a metal surface, particularly aluminum surface, the support is preferably subjected to the surface treatment such as graining, dipping in an aqueous solution of sodium silicate, potassium fluorozirconate or phosphate, or anodic oxidation.

An aluminum plate subjected to graining and then to dipping in an aqueous solution of sodium silicate is preferably used. Furthermore, an aluminum plate subjected to anodic oxidation and then to dipping in an aqueous solution of alkali metal silicate described in JP-B-47-5125 is suitably used. The anodic oxidation is performed by applying current to the aluminum plate as an anode in an electrolytic solution, for example, in an aqueous or non-aqueous solution of an inorganic acid such as phosphoric acid, chromic acid, sulfuric acid or boric acid or of an organic acid such as oxalic acid or sulfamic acid. These solutions may be used individually or in combination of two or more thereof.

The silicate electrodeposition described in U.S. Pat. No. 3,658,662 is also effective.

A surface treatment comprising a combination of the above-described anodic oxidation and sodium silicate treatment with electrolysis graining disclosed in JP-B-46-27481, JP-A-52-58602 and JP-A-52-30503 is also effective.

A support subjected in sequence to mechanical graining, chemical etching, electrolysis graining, anodic oxidation and sodium silicate treatment disclosed in JP-A-56-28893 is also preferred.

A support subjected, after the above-described treatments, to undercoating with a water-soluble resin such as a polymer or copolymer having a polyvinyl phosphonic acid or a sulfonic acid on the side chain or a polyacrylic acid, or with a water-soluble metal salt (e.g., zinc borate), a yellow dye or an amine salt, is also preferred.

A sol-gel treated substrate having conjugation-bonded thereto a functional group capable of addition reaction by radicals described in Japanese Patent Application No. 5-304358 is also preferred.

The above-described treatments to achieve hydrophilicity are effected not only to render the support surface hydrophilic but also to prevent harmful reaction of the photopolymerizable composition coated thereon and at the same time to improve the adhesion of the photosensitive layer.

In order to prevent polymerization inhibition by the oxygen in air, a protective layer comprising a polymer having an excellent oxygen cutting property, such as polyvinyl alcohol, in particular, polyvinyl alcohol having a saponification degree of 99% or more, or an acidic cellulose, may be provided on the photopolymerizable composition layer provided on the support. The method for coating such a protective layer is described in detail, for example, in U.S. Pat. No. 3,458,311 and JP-A-55-49729.

The photopolymerizable composition of the present invention can be used for usual photopolymerization. Furthermore, the composition can be used in various fields, for example, as a photoresist in fabricating a printing plate or a printed board. In particular, since the photopolymerizable composition of the present invention is characterized by the high sensitivity and wide spectral sensitivity extending even to a visible ray region, good effects may be obtained when it is applied to photosensitive materials for a visible ray laser such as $Ar^+$ laser or YAG-SHG laser.

The photosensitive material using the photopolymerizable composition of the present invention is subjected to imagewise exposure and then the unexposed area of the photosensitive layer is removed by a developer to obtain an image. When the photopolymerizable composition is used in manufacturing a lithographic printing plate, a developer described in JP-B-57-7427 is preferably used. The developer is suitably an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia, or an aqueous solution of an organic alkali agent such as monoethanolamine or diethanolamine. The alkali agent is added such that the solution has a concentration of from 0.1 to 10 wt %, preferably from 0.5 to 5 wt %.

The above-described alkaline aqueous solution may contain, if desired, a surface active agent or an organic solvent in a small amount, such as benzyl alcohol, 2-phenoxyethanol or 2-butoxyethanol. Examples thereof include those described in U.S. Pat. Nos. 3,375,171 and 3,615,480. Furthermore, the developers described in JP-A-50-26601, JP-A-58-54341, JP-B-56-39464 and JP-B-56-42860 are also excellent.

The present invention is described in greater detail below by referring to the Examples, however, the present invention should not be construed as being limited to these examples.

First, synthesis examples of the polymer binder are described.

SYNTHESIS EXAMPLE 1

Into 250 g of methanol, 75.6 g of allyl methacrylate, 35.2 g of (M-5), 13.2 g of methacrylic acid and 1.0 g of azobisisobutyronitrile were dissolved in a nitrogen atmosphere, and the resulting mixture was reacted at 70° C. for 8 hours while stirring. The reaction solution obtained was poured into water to precipitate a copolymer and through filtration and drying, Copolymer No. 1 was obtained. The molecular weight was measured by gel permeation chromatography, as a result, the weight average molecular weight was 245,000.

SYNTHESIS EXAMPLES 2 TO 25

Copolymer Nos. 2 to 25 shown in Tables 1 and 2 were synthesized in the same manner as in Synthesis Example 1 by varying the compositional ratio of monomers charged. These copolymers were measured on the weight average molecular weight by the same method as in Synthesis Example 1. The results are shown in Tables 1 and 2. In the Tables, the compositions and weight average molecular weights of Copolymer Nos. 26 to 30 as comparative polymer binders are also shown.

TABLE 1

| Copolymer No | Monomer Composition (mol % fed) | Weight Average Molecular weight |
|---|---|---|
| 1 | (M-5)/AllylMA/MAA 20/60/20 | 280,000 |
| 2 | (M-5)/AllylMA/MAA 25/60/15 | 241,000 |
| 3 | (M-5)/AllylMA/MAA 45/40/15 | 225,000 |
| 4 | (M-5)/AllylMA/MAA 35/50/15 | 165,000 |
| 5 | (M-6)/AllylMA/MAA 20/60/20 | 185,000 |
| 6 | (M-7)/AllylMA/MAA 15/60/25 | 222,000 |
| 7 | (M-8)/AllylMA/MAA 20/60/20 | 199,000 |
| 8 | (M-9)/AllylMA/MAA 20/60/20 | 51,000 |

TABLE 1-continued

| Copolymer No | Monomer Composition (mol % fed) | Weight Average Molecular weight |
|---|---|---|
| 9 | (M-10)/AllylMA/MAA 20/60/20 | 193,000 |
| 10 | (M-11)/AllylMA/MAA 20/60/20 | 185,000 |
| 11 | (M-12)/AllylMA/MAA 25/60/15 | 187,000 |
| 12 | (M-13)/AllylMA/MAA 20/60/20 | 64,000 |
| 13 | (M-15)/AllylMA/MAA 35/50/15 | 267,000 |
| 14 | (M-16)/AllylMA/MAA 25/60/15 | 163,000 |
| 15 | (M-17)/AllylMA/MAA 20/60/20 | 197,000 |
| 16 | (M-18)/AllylMA/MAA 45/40/15 | 212,000 |
| 17 | (M-19)/AllylMA/MAA 20/60/20 | 153,000 |
| 18 | (M-20)/AllylMA/MAA 25/60/15 | 83,000 |
| 19 | (M-21)/AllylMA/MAA 25/60/15 | 124,000 |

TABLE 2

| Copolymer No | Monomer Composition (mol % fed) | Weight Average Molecular Weight |
|---|---|---|
| 20 | (M-25)/AllylMA/MAA 20/60/20 | 96,000 |
| 21 | (M-27)/AllylMA/MAA 30/55/15 | 165,000 |
| 22 | (M-32)/AllylMA/MAA 30/60/10 | 174,000 |
| 23 | (M-36)/AllylMA/MAA 40/50/10 | 201,000 |
| 24 | (M-5)/(M-15)/AllylMA/MAA 25/20/40/15 | 165,000 |
| 25 | (M-10)/(M-15)/AllylMA/MAA 25/20/40/15 | 186,000 |
| 26 | AllylMA/MAA 80/20 | 210,000 |
| 27 | BzMA/MAA 80/20 | 199,000 |
| 28 | MMA/2-HEMA/MAA 60/20/20 | 165,000 |
| 29 | AllylMA/n-BuA/MAA 60/20/20 | 210,000 |
| 30 | MMA/2-HEMA/MAA 60/20/20 | 198,000 |

AllylMA: allyl methacrylate
BzMA: benzyl methacrylate
MAA: methacrylic acid
2-HEMA: 2-hydroxyethyl methacrylate
AA: acrylic acid
n-BuMA: n-butyl methacrylate

EXAMPLES 1 TO 3 AND COMPARATIVE EXAMPLE 1

A 0.30 mm-thick aluminum plate was subjected to graining of the surface thereof using a nylon blush and a water pension of 400-mesh pumice and then thoroughly washed with water. After dipping it in a 10 wt % sodium hydroxide at 70° C. for 60 seconds to effect etching, the plate was washed with flowing water, then neutralization-washed with a 20 wt % nitric acid and further washed with water. The resulting plate was subjected to electrolysis graining using a sine waveform alternating current under conditions of Va=12.7 V in a 1 wt % aqueous nitric acid solution with an anode time electricity quantity of 160 coulomb/dm$^2$. At this time, the surface roughness measured was 0.6 µm (Ra indication). Subsequently, the plate was dipped in a 30 wt % aqueous sulfuric acid solution at 55° C. for 2 minutes to effect desmutting and then subjected to anodic oxidation in a 20 wt % aqueous sulfuric acid solution at a current density of 2 A/dm$^2$ for 2 minutes to give an anodic oxide film having a thickness of 2.7 g/m$^2$.

On the thus-treated aluminum plate, a photosensitive composition having the following composition was coated and then dried at 80° C. for 2 minutes to form a photosensitive layer.

| Composition of Photosensitive Layer | |
|---|---|
| Pentaerythritol tetraacrylate | 1.5 g |
| Binder shown in Table 3 | 2.0 g |
| S-1 | 0.1 g |
| S-2 | 0.2 g |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/m$^2$ |

On the thus-formed photosensitive layer, a 3 wt % aqueous solution of polyvinyl alcohol (saponification degree: 86.5–89 mol %, polymerization degree: 1,000) was coated to have a dry coated weight of 2 g/m$^2$ and dried at 100° C. for 2 minutes.

Then, a step tablet (manufactured by Fuji Photo Film Co., Ltd.) in which the intensity of light attenuates by 1/1.4 every one step elevation was tightly contacted onto the surface of the photosensitive lithographic printing plate obtained above and exposure was applied thereon for 30 seconds while adjusting the intensity of light such that the illuminance on the photosensitive layer surface was 0.0132 mW/cm$^2$.

The visible ray used was a monochromatic light from a xenon lamp light source, applied through Kenko Optical Filter BP-48.

Thereafter, the plate was heated at 100° C. for 1 minute and dipped in the following developer at 25° C. for 20 seconds to effect development.

| | |
|---|---|
| 1K Potassium silicate | 30 g |
| Potassium hydroxide | 15 g |
| $C_{12}H_{25}$—$C_6H_4$—O—$C_6H_4$—$SO_3Na$ | 3 g |
| Water | 1,000 g |

The following items were evaluated and the results obtained are shown in Table 3.
1. Sensitivity
The sensitivity was shown by the clear part step number of the step tablet. The higher the step number, the higher the sensitivity.
2. Tone alue
The tone value was judged by the difference between the solid part step number and the clear part step number of the step tablet. The smaller the difference, the shorter the length of middle tone and the more excellent the tone value.
3. Development Allowableness
The development was performed by varying the development time, a developing ink PI-2 (emulsion type ink, produced by Fuji Photo Film Co., Ltd.) was coated on the plate using a sponge, and then the plate was washed with water to remove the ink on the non-image area. At this time, the development time when the solid part was completely inked and the non-image area was freed from ink staining was measured.

The results are shown in Table 3.

TABLE 3

| | Co-polymer No. | Sensitivity, Step No. of Clear Part | Gradation, Difference in Step No. between Clear Part and Solid Part | Development Allowableness (time) |
|---|---|---|---|---|
| Example 1 | 1 | 8.5 | 2.5 | 10 sec-6 min |
| Example 2 | 2 | 9.5 | 3.0 | 20 sec-6 min |
| Example 3 | 9 | 9.5 | 2.5 | 10 sec-7 min |
| Comparative Example 1 | 26 | 8.5 | 4.0 | 1 min-7 min |

EXAMPLES 4 AND 5 AND COMPARATIVE EXAMPLE 2

Photosensitive lithographic printing plates were obtained in the same manner as above except for changing the photosensitive composition in the Examples and Comparative Example to the following composition, and evaluated in the same manner. The results are shown in Table 4.

| Composition of Photosensitive Layer | |
|---|---|
| Pentaerythritol tetraacrylate | 1.5 g |
| Binder shown in Table 4 | 2.5 g |
| S-1 | 0.1 g |
| S-2 | 0.2 g |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/m² |

TABLE 4

| | Co-polymer No. | Sensitivity, Step No. of Clear Part | Gradation, Difference in Step No. between Clear Part and Solid Part | Development Allowableness (time) |
|---|---|---|---|---|
| Example 4 | 5 | 9.0 | 3.5 | 20 sec-8 min |
| Example 5 | 8 | 8.5 | 4.0 | 30 sec-6 min |
| Comparative Example 2 | 27 | 7.0 | 5.0 | 50 sec-6 min |

EXAMPLES 6 TO 9 AND COMPARATIVE EXAMPLE 3

Photosensitive lithographic printing plates were obtained in the same manner as above except for changing the photosensitive composition in the Examples and Comparative Example to the following composition, and evaluated in the same manner. The results are shown in Table 5.

| Composition of Photosensitive Layer | |
|---|---|
| Pentaerythritol tetraacrylate | 1.5 g |
| Binder shown in Table 5 | 2.5 g |
| S-3 | 0.15 g |
| S-2 | 0.2 g |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/m² |

TABLE 5

| | Co-polymer No. | Sensitivity, Step No. of Clear Part | Gradation, Difference in Step No. between Clear Part and Solid Part | Development Allowableness (time) |
|---|---|---|---|---|
| Example 6 | 6 | 5.5 | 3.0 | 20 sec-6 min |
| Example 7 | 7 | 6.5 | 3.0 | 20 sec-8 min |
| Example 8 | 13 | 6.0 | 3.0 | 10 sec-6 min |
| Example 9 | 24 | 6.0 | 3.0 | 10 sec-5 min |
| Comparative Example 3 | 28 | 4.5 | 4.5 | 10 sec-2 min |

EXAMPLES 10 AND 11 AND COMPARATIVE EXAMPLE 4

Photosensitive lithographic printing plates were obtained in the same manner as above except for changing the photosensitive composition in the Examples and Comparative Example to the following composition, and evaluated in the same manner. The results are shown in Table 6.

| Composition of Photosensitive Layer | |
|---|---|
| Pentaerythritol tetraacrylate | 1.5 g |
| Binder shown in Table 6 | 2.5 g |
| S-1 | 0.15 g |
| S-2 | 0.2 g |
| S-4 | 0.3 g |
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 1.5 g/m² |

TABLE 6

| | Co-polymer No. | Sensitivity, Step No. of Clear Part | Gradation, Difference in Step No. between Clear Part and Solid Part | Development Allowableness (time) |
|---|---|---|---|---|
| Example 10 | 10 | 9.0 | 3.5 | 10 sec-5 min |
| Example 11 | 16 | 9.0 | 3.5 | 10 sec-8 min |
| Comparative Example 4 | 29 | 7.5 | 4.5 | 1 min-6 min |

EXAMPLES 12 AND 15 AND COMPARATIVE EXAMPLE 5

Photosensitive lithographic printing plates were obtained in the same manner as above except for changing the photosensitive composition in the Examples and Comparative Example to the following composition, and evaluated in the same manner. The results are shown in Table 7.

| Composition of Photosensitive Layer | |
|---|---|
| Pentaerythritol tetraacrylate | 2.0 g |
| Binder shown in Table 7 | 3.0 g |
| S-1 | 0.15 g |
| S-2 | 0.2 g |

-continued

| Composition of Photosensitive Layer | |
|---|---|
| Fluorine-based nonionic surface active agent | 0.03 g |
| Copper phthalocyanine pigment (organic polymer dispersion) | 0.1 g |
| Methyl ethyl ketone | 20.0 g |
| Propylene glycol monomethyl ether acetate | 20.0 g |
| Dry coated weight | 2.2 g/m$^2$ |

TABLE 7

| | Co-polymer No. | Sensitivity, Step No. of Clear Part | Gradation, Difference in Step No. between Clear Part and Solid Part | Development Allowableness (time) |
|---|---|---|---|---|
| Example 12 | 12 | 8.0 | 4.0 | 20 sec-8 min |
| Example 13 | 18 | 8.5 | 3.5 | 20 sec-5 min |
| Example 14 | 21 | 8.5 | 4.0 | 10 sec-8 min |
| Example 15 | 25 | 9.5 | 3.5 | 10 sec-5 min |
| Comparative Example 5 | 29 | 7.5 | 4.5 | 1 min-6 min |

EXAMPLES 16 TO 20 AND COMPARATIVE EXAMPLES 6 AND 7

Photosensitive lithographic printing plates manufactured in the same manner as in the Examples and Comparative Examples above each was scan-exposed by a 75 mW air cooled argon laser in an exposure amount of 150 µm and then developed with the above-described developer for 20 seconds, followed by water washing. A gum solution obtained by two-fold diluting a protective gum GU-7 (produced by Fuji Photo Film Co., Ltd.) with water was coated thereon by a sponge and then dried.

The resulting printing plates each was subjected to printing in a printer, SOR-KZ manufactured by Heidelberg, and the number of printed sheets (gum removability), press life and scumming on the non-image area until the ink density of the printed matter became constant were evaluated.

The results are shown in Table 8. The evaluation results were the same even if the plate had a structure according to any photosensitive layer in the Examples and Comparative Examples above.

TABLE 8

| | Copolymer No. | Gum Removability | Impression Capability | Non-Image Area Scumming |
|---|---|---|---|---|
| Example 16 | 2 | 15 Sheets | 100,000 sheets or more | Good (no scumming) |
| Example 17 | 7 | 20 Sheets | 100,000 sheets or more | Good |
| Example 18 | 10 | 15 Sheets | 100,000 sheets or more | Good |
| Example 19 | 17 | 15 Sheets | 100,000 sheets or more | Good |
| Example 20 | 25 | 15 Sheets | 100,000 sheets or more | Good |
| Comparative Example 6 | 27 | 20 Sheets | 100 sheets | Scummed |
| Comparative Example 7 | 28 | 50 Sheets | 300 sheets | Good |

The effect of the present invention can be clearly seen from the foregoing. The chemical formulae of S-1 to S-4 used are shown below.

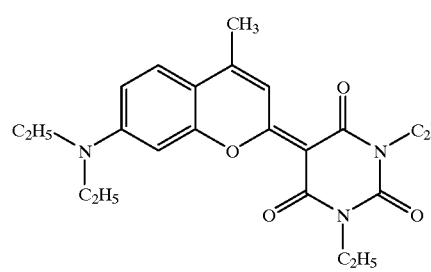

S-1

-continued

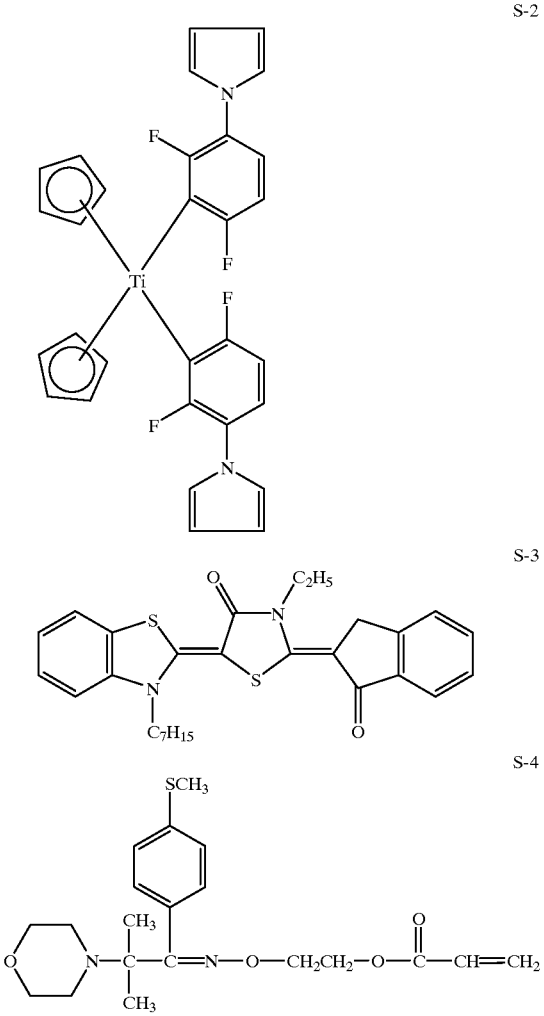

The photopolymerizable composition of the present invention has high sensitivity to active beams in the visible ray region and when used for a lithographic printing plate or the like, it ensures well-balanced capabilities such as developability, inking property, tone value and press life.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising at least A) a compound having an addition-polymerizable ethylenically unsaturated bond, B) a metallocene compound photopolymerization initiator and C) a polymer binder having an amido group on the side chain thereof and being substantially soluble in an alkali water wherein said polymer binder is an organic polymer compound having at least an amido group represented by the following formula (1), an alkenyl-containing group represented by the following formula (2) and a carboxyl group on the side chain thereof:

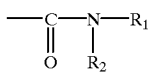

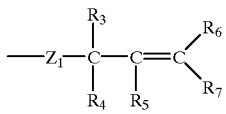

wherein in formula (1), $R_1$ and $R_2$ each independently represents a hydrogen atom, an alkyl group which may have substituent, an alkenyl group which may have substituent, an alkynyl group which may have substituent, an aryl group which may have substituent, a heterocyclic group or a substituted sulfonyl group, and $R_1$ and $R_2$ may be combined to form a ring structure; and in formula (2), $R_3$ to $R_7$ each independently represents a hydrogen atom, a halogen atom, a carboxyl group, a sulfonato group, a nitro group, a cyano group, an amido group, an amino group, an alkyl group which may have substituent, an alkenyl group which may have substituent, an alkynyl group which may have substituent, an aryl group which may have substituent, a substituted oxy group or a substituted sulfonyl group, and $Z_1$ represents an oxygen atom, a sulfur atom or $NR_8$ wherein $R_8$ represents a hydrogen atom or an alkyl group.

2. The photopolymerizable composition as claimed in claim 1, wherein B) the metallocene compound photopolymerization initiator is a titanocene compound.

3. The photopolymerizable composition as claimed in claim 1, which further contains a compound represented by formula (3) as a visible ray sensitizing dye:

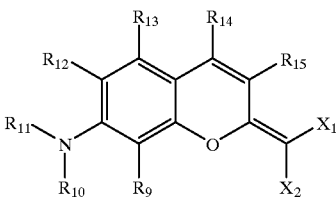

wherein $R_9$ to $R_{13}$ each independently represents a hydrogen atom, a halogen atom, an alkyl group, an aryl group, an alkenyl group, a hydroxyl group, a substituted oxy group, a mercapto group, an amino group, a substituted carbonyl group, a sulfo group, a sulfonato group, a substituted sulfinyl group, a substituted sulfonyl group, a phosphono group, a phosphonato group, a cyano group, a nitro group or a silyl group, $R_9$ and $R_{10}$ or $R_{11}$ and $R_{12}$ may form a ring comprising a nonmetallic atom together with the carbon atoms to which $R_9$ and $R_{10}$ or $R_{11}$ and $R_{12}$ are bonded, $R_{14}$ and $R_{15}$ each independently represents a hydrogen atom, a halogen atom, an alkyl group, an aryl group, an alkenyl group, a hydroxyl group, a substituted oxy group, a mercapto group, an amino group, a substituted carbonyl group, a sulfo group, a sulfonato group, a substituted sulfinyl group, a substituted sulfonyl group, a phosphono group, a phosphonato group, a cyano group, a nitro group, a silyl group or a heterocyclic group, $R_{13}$ and $R_{14}$ or $R_{14}$ and $R_{15}$ may form a ring comprising a nonmetallic atom together with the carbon atoms to which $R_{13}$ and $R_{14}$ or $R_{14}$ and $R_{15}$ are bonded, $X_1$ and $X_2$ each represents a cyano group or a substituted carbonyl group, and $X_1$ and $X_2$ may be combined to form a ring.

* * * * *